(12) United States Patent
Hashimoto et al.

(10) Patent No.: US 9,241,431 B2
(45) Date of Patent: Jan. 19, 2016

(54) ELECTROMAGNETIC SHIELDING TOOL AND WIRE HARNESS

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Oska-shi, Osaka (JP)

(72) Inventors: Daisuke Hashimoto, Yokkaichi (JP); Kouji Fukumoto, Yokkaichi (JP); Toshiya Hirooka, Yokkaichi (JP); Akihiro Nagafuchi, Yokkaichi (JP); Hiroyuki Matsuoka, Yokkaichi (JP); Takuya Tate, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/373,152

(22) PCT Filed: Jan. 17, 2013

(86) PCT No.: PCT/JP2013/050791
§ 371 (c)(1),
(2) Date: Jul. 18, 2014

(87) PCT Pub. No.: WO2013/111665
PCT Pub. Date: Aug. 1, 2013

(65) Prior Publication Data
US 2015/0027772 A1    Jan. 29, 2015

(30) Foreign Application Priority Data

Jan. 23, 2012  (JP) ................................. 2012-010943
Aug. 28, 2012  (JP) ................................. 2012-187463

(51) Int. Cl.
*H05K 9/00*    (2006.01)
*H01B 7/00*    (2006.01)
(Continued)

(52) U.S. Cl.
CPC .......... *H05K 9/0052* (2013.01); *B60R 16/0215* (2013.01); *H01B 7/0045* (2013.01); *H02G 3/0487* (2013.01)

(58) Field of Classification Search
CPC ... H05K 9/0052; H01B 7/0045; H02G 3/0487
USPC ...................................... 174/32, 34, 350, 363
See application file for complete search history.

(56) References Cited

U.S. PATENT DOCUMENTS

2002/0170729 A1 * 11/2002 Murakami et al. .......... 174/35 R
2003/0119351 A1 *  6/2003 Miyazaki et al. ............. 439/271
(Continued)

FOREIGN PATENT DOCUMENTS

EP    2 797 397 A1    10/2014
JP    A-S57-48683    3/1982
(Continued)

OTHER PUBLICATIONS

Feb. 19, 2013 Search Report issued in International Patent Application No. PCT/JP2013/050791.
(Continued)

*Primary Examiner* — Hoa C Nguyen
*Assistant Examiner* — Amol Patel
(74) *Attorney, Agent, or Firm* — Oliff PLC

(57) ABSTRACT

An electromagnetic shielding tool that includes a metallic cloth and two bracket body portions. The two bracket body portions each include two elongated portions and a coupling portion, and respectively hold a first outer edge portion and a second outer edge portion on the side opposite to the first outer edge portion among four outer edge portions of the metallic cloth so as to form a ring that surrounds the periphery of electrical wires. The two elongated portions are made of a conductive material, are joined to the metallic cloth in the state of being arranged in series along an outer edge portion of the metallic cloth, and form a ring shape due to being combined with each other on two sides of the electrical wires. The coupling portion couples end portions of the two elongated portions to each other and holds the two elongated portions in the ring shape.

12 Claims, 12 Drawing Sheets

(51) Int. Cl.
*H02G 3/04* (2006.01)
*B60R 16/02* (2006.01)

(56) References Cited

U.S. PATENT DOCUMENTS

2006/0185872 A1* 8/2006 Rodrigues et al. .............. 174/36
2009/0130903 A1   5/2009 Tsukashima et al.
2010/0212952 A1* 8/2010 Abdelmoula et al. ........ 174/390

FOREIGN PATENT DOCUMENTS

| | | |
|---|---|---|
| JP | S5748683 U * | 3/1982 |
| JP | A-H05-079579 | 3/1993 |
| JP | A-H07-015165 | 1/1995 |
| JP | H10-224943 A | 8/1998 |
| JP | 2002-271082 A | 9/2002 |
| JP | A-2003-197037 | 7/2003 |
| JP | A-2006-344398 | 12/2006 |
| JP | 2009068515 A * | 4/2009 |
| JP | A-2009-068515 | 4/2009 |
| JP | 2009-140988 A | 6/2009 |
| JP | 2009-147052 A | 7/2009 |
| WO | 03/001566 A2 | 1/2003 |
| WO | 2009/025349 A1 | 2/2009 |
| WO | 2011/155581 A1 | 12/2011 |

OTHER PUBLICATIONS

Jun. 3, 2015 Search Report issued in European Application No. 13741027.0.

* cited by examiner

ELECTROMAGNETIC SHIELDING TOOL AND WIRE HARNESS

TECHNICAL FIELD

This application is directed to an electromagnetic shielding tool for blocking electromagnetic noise in a wire harness installed in a vehicle, and a wire harness including the same.

BACKGROUND

Conventionally, a tube-shaped braided wire such as that shown in Patent Document 1 has normally been used as a shielding member that can change in shape in accordance with a change in the shape of an electrical wire. In Patent Document 1, when the electrical wire is introduced into a metal casing through an opening in the casing, one end of the tube-shaped braided wire is placed over the frame portion of the opening in the metal casing. The tube-shaped braided wire is then fixed to the frame portion of the opening in the casing using a crimping ring.

Note that there are also cases where the frame portion of the opening for electrical wire introduction in the metal casing is provided as an independent member. In this case, the frame portion is fixed to the opening portion of the casing using a screw or the like. Such an independent member is generally called a "shield shell". In the following description, the frame portion of the opening for electrical wire introduction in the metal casing (including the shield shell) will be called the "shield frame portion".

CITATION LIST

Patent Documents

Patent Document 1: JP 2006-344398A

Technical Problem

Incidentally, the braided wire is tube-shaped. For this reason, the electrical wire basically needs to be inserted into the braided wire before the connector is attached to its terminal. This is generally referred to as pre-insertion. The need for this pre-insertion of the electrical wire limits the degree of freedom in wire harness manufacturing and the wiring procedure.

Providing the braided wire on the electrical wire after the connector is attached to the terminal of the electrical wire, that is to say enabling post-provision of the braided wire, would require the use of a large braided wire. In this case, it would be necessary to use a needlessly large braided wire that allows the insertion of a connector or the like that has a larger outer shape than the electrical wire. This would lead to an increase in the layout space, weight, and manufacturing cost of the wire harness, and is unrealistic.

Also, in the task in which the tube-shaped braided wire with the electrical wire pre-inserted therein is placed over the shield frame portion, the position of the braided wire needs to be shifted in the axial direction of the electrical wire. If the two ends of the braided wire are placed over respective shield frame portions of two casings arranged relatively close to each other, there is little leeway in the space for shifting the position of the braided wire. The task of placing the braided wire over the shield frame portion is therefore difficult.

In view of the above, currently there is demand for the ability to perform post-provision of a shielding member on an electrical wire and a casing while also avoiding an increase in the size of the shielding member, in order to facilitate the task of attaching the shielding member and increase the degree of freedom in the procedure for the same.

It is an object of this disclosure to make it possible to perform post-provision of a shielding member or wire harness on an electrical wire and a casing without an accompanying increase in the layout space, weight, and manufacturing cost of the wire harness.

SUMMARY

According to embodiments, there is provided an electromagnetic shielding tool comprising: a metallic cloth including a first outer edge portion and a second outer edge portion on a side opposite to the first outer edge portion, the metallic cloth comprising a metallic thread fabric; and a plurality of bracket sets configured to hold the first outer edge portion and the second outer edge portion in a shape of a ring that surrounds a periphery of an electrical wire, wherein each of the bracket sets comprises: two elongated portions comprising a conductive material, the elongated portions joined to the metallic cloth and arranged in series along an outer edge portion of the metallic cloth and fixed to each other on two opposite sides of the electrical wire to form the ring that surrounds the electrical wire; and at least one coupling portion that couples end portions of the two elongated portions to each other to fix the two elongated portions in the ring shape.

There is also provided wire harness comprising: an electrical wire; and an electromagnetic shielding tool that surrounds a periphery of the electrical wire, wherein the electromagnetic shielding tool comprises: a metallic cloth including a first outer edge portion and a second outer edge portion on a side opposite to the first outer edge portion, the metallic cloth comprising a metallic thread fabric; and a plurality of bracket sets configured to hold the first outer edge portion and the second outer edge portion in a shape of a ring that surrounds a periphery of the electrical wire, wherein each of the bracket sets comprises: two elongated portions comprising a conductive material, the elongated portions joined to the metallic cloth and arranged in series along an outer edge portion of the metallic cloth and fixed to each other on two opposite sides of the electrical wire to form the ring that surrounds the electrical wire; and at least one coupling portion (20,4) that couples end portions of the two elongated portions to each other to fix the two elongated portions in a ring shape.

An electromagnetic shielding tool according to a first embodiment includes a metallic cloth that is a metallic thread fabric and two bracket sets. The two bracket sets respectively hold, among four outer edge portions of the metallic cloth, a first outer edge portion and a second outer edge portion on a side opposite to the first outer edge portion in a shape of ring that surrounds a periphery of the electrical wire. Each of the two bracket sets includes two elongated portions and a coupling portion. The two elongated portions are made of a conductive material and are joined to the metallic cloth in a state of being arranged in series along an outer edge portion of the metallic cloth. Furthermore, the two elongated portions form a ring that surrounds the electrical wire due to being combined with each other on two sides of the electrical wire. The coupling portion couples end portions of the two elongated portions to each other and holds the two elongated portions in a ring shape.

An electromagnetic shielding tool according to a second embodiment is a variation of the electromagnetic shielding tool according to the first embodiment. In the electromagnetic shielding tool according to the second embodiment, each of the elongated portions of each of the two bracket sets is formed so as to be longer than, among the four outer edge portions of the metallic cloth, the length of a third outer edge portion and a fourth outer edge portion. The third outer edge portion and the fourth outer edge portion are outer edge portions other than the first outer edge portion and the second outer edge portion.

An electromagnetic shielding tool according to a third embodiment is a variation of the electromagnetic shielding tool according to the first or second embodiments. In the electromagnetic shielding tool according to the third embodiment, the two elongated portions of each of the two bracket sets are configured by a continuous member together with a connecting portion that is flexible and connects one end of each of the two elongated portions.

An electromagnetic shielding tool according to a fourth embodiment is a variation of the electromagnetic shielding tool according to any of the first to third embodiments. In the electromagnetic shielding tool according to the fourth embodiment, in each of the two bracket sets, the coupling portion couples the two elongated portions in a state in which respective end portions of the two elongated portions joined to the metallic cloth overlap each other.

An electromagnetic shielding tool according to a fifth embodiment is a variation of the electromagnetic shielding tool according to any of the first to third embodiments. The electromagnetic shielding tool according to the fifth embodiment further includes a metallic cloth joining member that is a metal member that is joined by welding to, among the four outer edge portions of the metallic cloth, a third outer edge portion and a fourth outer edge portion. The third outer edge portion and the fourth outer edge portion are outer edge portions other than the first outer edge portion and the second outer edge portion.

An electromagnetic shielding tool according to a sixth embodiment is a variation of the electromagnetic shielding tool according to any of the first to fifth embodiments. In the electromagnetic shielding tool according to the sixth embodiment, in each of the two bracket sets, a plurality of projections are formed on inner surfaces of the two elongated portions on sides on which the elongated portions oppose each other.

An electromagnetic shielding tool according to a seventh embodiment is a variation of the electromagnetic shielding tool according to any of the first to sixth embodiments. In the electromagnetic shielding tool according to the seventh embodiment, in each of the two bracket sets, outer surfaces of the two elongated portions on sides opposite to sides on which the elongated portions oppose each other are joined to the metallic cloth.

An electromagnetic shielding tool according to an eighth embodiment is a variation of the electromagnetic shielding tool according to any of the first to sixth embodiments. In the electromagnetic shielding tool according to the eighth embodiment, the elongated portions are respectively pressure-joined to the first outer edge portion and the second outer edge portion of the metallic cloth. Accordingly, the elongated portions are each joined to the metallic cloth.

An electromagnetic shielding tool according to a ninth embodiment is a variation of the electromagnetic shielding tool according to the eighth embodiment. In the electromagnetic shielding tool according to the ninth embodiment, a boundary portion between an end surface and a surface that is in contact with the metallic cloth in a portion of each of the elongated portions pressure-joined to the metallic cloth is a chamfered portion.

An electromagnetic shielding tool according to a tenth embodiment is a variation of the electromagnetic shielding tool according to any of the first to ninth embodiments. In the electromagnetic shielding tool according to the tenth embodiment, the two elongated portions in each of the two bracket sets are respectively provided with standing portions for positioning that stand up in a direction in which the elongated portions oppose each other.

The electromagnetic shielding tool according to embodiments may also be a wire harness that includes an electrical wire and the electromagnetic shielding tool according to any of the first to tenth embodiments that surrounds the periphery of the electrical wire.

Advantageous Effects of Disclosed Embodiments

In the electromagnetic shielding tool according to the first embodiment, the two elongated portions that configure each of the two bracket sets are members that relay the electrical connection between the metallic cloth and casings. The two elongated portions are fixed to a portion of a corresponding metal casing, such as the shield frame portion of the casing. The metallic cloth is electrically connected to the casings via the two bracket sets, and is in a casing ground state.

With the electromagnetic shielding tool according to the first embodiment, two elongated portions made of a conductive material are combined on two sides of an electrical wire and held in a ring shape. Accordingly, the metallic cloth joined to the two elongated portions forms a tube that surrounds the periphery of the electrical wire.

In other words, the electromagnetic shielding tool according to the first embodiment is not a member that forms a tube in advance, and therefore post-provision of the electromagnetic shielding tool to the electrical wire is possible.

Also, in the electromagnetic shielding tool according to the first embodiment, a metallic cloth of a size for surrounding the periphery of the electrical wire with no excess or deficiency may be employed. In this case, there is no increase in layout space, weight, or manufacturing cost.

Also, in the electromagnetic shielding tool according to the first embodiment, the two elongated portions that configure each of the two bracket sets are coupled by the coupling portion in a state of forming a ring while clamping the shield frame portion of the corresponding casing. Furthermore, the coupling portion holds the two combined elongated portions in a ring shape. Accordingly, the metallic cloth joined to the two elongated portions is held in the shape of a tube that surrounds the periphery of the electrical wire.

In other words, the two bracket sets play the role of holding the metallic cloth in a tube shape and the role of maintaining the electrical connection between the metallic cloth and the shield frame portions of the casings. Accordingly, if the electromagnetic shielding tool according to the first embodiment is applied, parts management is simplified and the man-hours required in handling is reduced compared to the case where multiple members are handled due to the application of a conventional braided wire and a crimp fitting.

Incidentally, as will be described later, when a braided wire or a metallic cloth is fixed due to being clamped between the shield frame portion of a casing and another fixing member such as a crimp fitting, it easily slips off of the shield frame portion.

On the other hand, in the electromagnetic shielding tool according to this disclosure, the metallic cloth and the elongated portions of the two bracket sets are joined in advance. For this reason, the two bracket sets can be directly fixed to the shield frame portions of the casings without interposing the metallic cloth therebetween. Accordingly, the problem of the electromagnetic shielding tool detaching from the shield frame portions of the casings does not easily occur.

Also, the following case is conceivable as a typical first case of application of the electromagnetic shielding tool according to the second embodiment. This is a case in which the length of the metallic cloth is particularly short due to the two casings, to which the two bracket sets are to be respectively fixed, being arranged in the vicinity of each other. In this case, it is particularly favorable to apply the electromagnetic shielding tool capable of post-provision.

Specifically, the electromagnetic shielding tool that is capable of post-provision does not require the position of the metallic cloth to be shifted to one side in the lengthwise direction of the electrical wire in the task of attachment to a casing. For this reason, even in the case where there is little leeway in the workspace, the electromagnetic shielding tool capable of post-provision can be attached in an easy task.

Also, the following case is conceivable as a typical second case of application of the electromagnetic shielding tool according to the second embodiment. This is a case in which the shield frame portions of the casings, to which the brackets are to be fixed, have a large width, and therefore the elongated portions of the brackets are correspondingly formed so as to be long. A conventional electromagnetic shielding tool has a structure in which a braided wire is clamped between a fixing member and the shield frame portion of a casing. For this reason, the larger the width of the shield frame portion is, the more the force with which the fixing member fastens the shield frame portion is distributed, and the more remarkable the problem of slipping off of the shield frame portion becomes.

However, as previously described, the two bracket sets according to embodiments can be directly fixed to the shield frame portions of the casings without interposing the metallic cloth therebetween. For this reason, if the electromagnetic shielding tool according to the second embodiment is applied in the typical second case, the effect of suppressing detachment from the shield frame portions of the casings is more remarkable.

Also according to the third embodiment, the number of parts is reduced compared to the case where the two elongated portions of each of the two bracket sets are each a separate member. This makes it possible to reduce the man-hours in attachment of the electromagnetic shielding tool to the casings.

Also, according to the fourth embodiment, the metallic cloth is held in the shape of a tube having substantially no gap and overlaps itself in the two outer edge portions that form the two end portions in the direction of surrounding the periphery of the electrical wire (the third outer edge portion and the fourth outer edge portion). For this reason, electromagnetic noise is more reliably blocked, and stable shielding performance is obtained.

Also, according to the fifth embodiment, the metallic cloth is joined via a metal member in the two outer edge portions that form the two end portions in the direction of surrounding the periphery of the electrical wire (the third outer edge portion and the fourth outer edge portion). As a result, the metallic cloth is formed into a tube that has no gap in conjunction with the metal member. For this reason, electromagnetic noise is more reliably blocked, and stable shielding performance is obtained.

Also, according to the sixth embodiment, the frictional resistance of the brackets and the elongated portions of the casings increases due to the effect of the projections formed on the inner surfaces of the elongated portions. This increases the retaining force of the brackets with respect to the shield frame portions of the casings. As a result, the problem of the electromagnetic shielding tool detaching from the shield frame portions of the casings can be further suppressed.

Also, in the seventh embodiment, the metallic cloth is joined to the outer surfaces of the elongated portions. For this reason, the metallic cloth is not sandwiched between the elongated portions and the shield frame portions of the casings. Accordingly, the portions of the elongated portions that come into contact with the shield frame portions of the casings and the portions of the elongated portions that are joined to the metallic cloth do not need to be formed separately in order to prevent clamping of the metallic cloth. As a result, it is possible to reduce the size of the elongated portions (the brackets).

Also, if the elongated portions and the metallic cloth are joined by welding, there is the risk of damage to the thin metallic cloth. In the eighth embodiment, the elongated portions are each joined to the metallic cloth by being pressure-joined to an outer edge portion of the metallic cloth. Accordingly, it is possible to join the elongated portions and the metallic cloth while preventing damage to the thin metallic cloth.

Also, in the ninth embodiment, the boundary portion between the end surface and the surface that is in contact with the metallic cloth in a portion of each of the elongated portions pressure-joined to the metallic cloth is a chamfered portion. This prevents the metallic cloth from being damaged due to being rubbed by the corners of the edges of the elongated portions.

Also, in the tenth embodiment, a standing portion for positioning is formed on each of the elongated portions. These standing portions are fitted into holes for positioning that are formed in the partner member to which the brackets are connected. Accordingly, the brackets and the partner member can be easily connected in the correct positional relationship.

Applying the wire harness according to the eleventh embodiment of this disclosure obtains effects similar to the effects described in connection with the electromagnetic shielding tool according to the first embodiment.

DETAILED DESCRIPTION

Disclosed embodiments will be described below with reference to the accompanying drawings. The following embodiments are exemplary embodiments and are not intended to limit the technical scope of this disclosure. The electromagnetic shielding tool of the embodiments described below is an electrical component for attachment to an electrical wire of a wire harness installed in a vehicle. The electromagnetic shielding tool blocks electromagnetic noise using a conductive metallic cloth that surrounds the periphery of the electrical wire.

First Embodiment

First, the configurations of an electromagnetic shielding tool 1 and a wire harness 100 according to the first embodiment will be described with reference to FIGS. 1 to 6.

Figure 1:
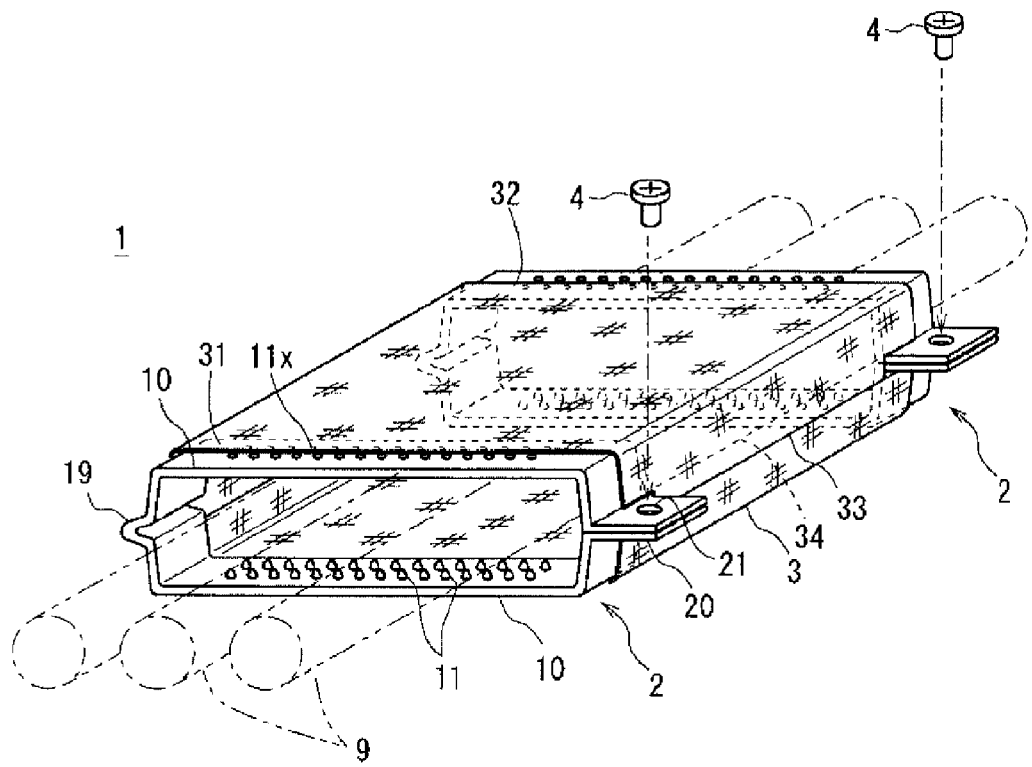
FIG. 1 is a perspective view of an electromagnetic shielding tool 1 according to a first embodiment of this disclosure.

As shown in FIG. 1, the electromagnetic shielding tool 1 is configured by two bracket body portions 2, a metallic cloth 3 joined to each of the two bracket body portions 2, and two screws 4, which are fasteners for fixing the two bracket body portions 2 to metal casings.

One of the bracket body portions 2 and one of the screws 4 configure one bracket set, and the other bracket body portion 2 and the other screw 4 configure another bracket set. In the following description, one bracket body portion 2 and one screw 4 for fixing that bracket body portion to the casing will be collectively called a bracket set 2,4. In other words, the electromagnetic shielding tool 1 includes two bracket sets 2,4.

One of the two bracket sets 2,4 is fixed to a portion of a casing 8 that accommodates a device to which one end of an electrical wire 9 is connected, and the other one of the two bracket sets 2,4 is fixed to a portion of a casing 8 that accommodates a device to which the other end of the electrical wire 9 is connected.

Figure 4:
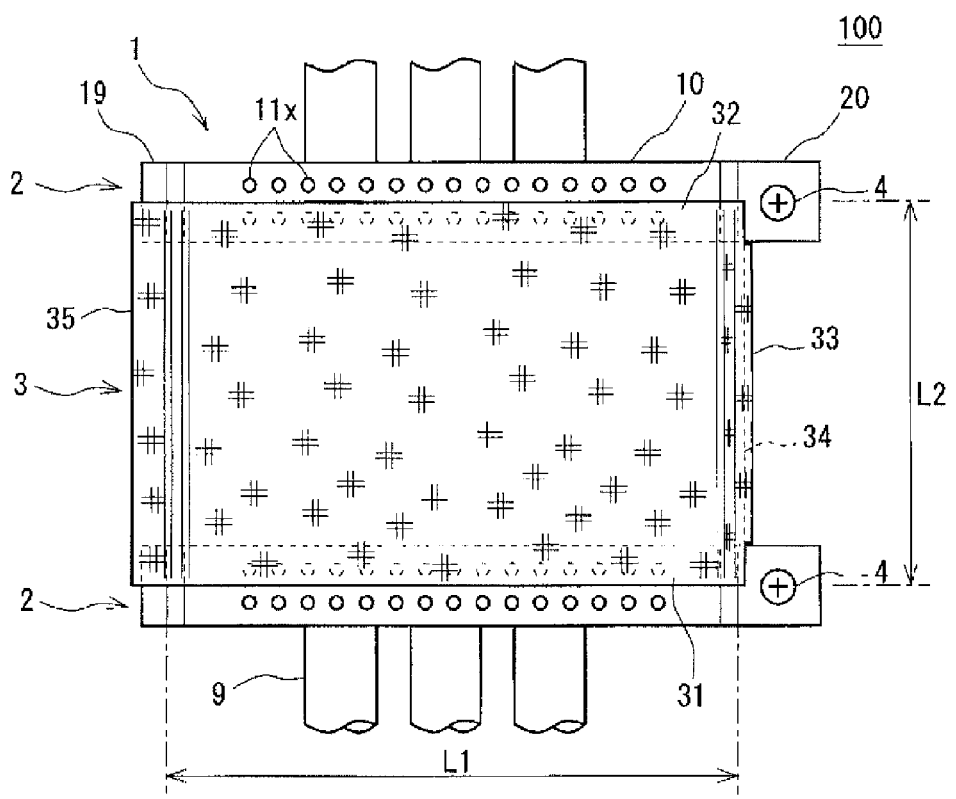
FIG. 4 is a plan view of a wire harness 100 according to the first embodiment of this disclosure.

Also, as shown in FIG. 4, the wire harness 100 includes multiple electrical wires 9 and an electromagnetic shielding tool 1 that covers the periphery of the electrical wires 9 collectively.

Electrical Wire

Each of the electrical wires 9 is an insulated electrical wire configured by a core wire made of a conductive material and an insulating coating made of an insulating material that covers the periphery of the core wire. Normally, metal terminals (not shown) are connected to the core wire in the end portions of the electrical wire 9. Also, there are cases where the wire harness 100 includes an electrical wire group holding member (not shown) made of a resin material. The electrical wire holding member holds the end portions of multiple electrical wires 9 in a certain positional relationship, and electrically insulates the electrical wires 9 from each other. Note that the electrical wires 9 are drawn with virtual lines (dashed double-dotted lines) in FIGS. 1 to 3.

Metallic Cloth

The metallic cloth 3 constituting the electromagnetic shielding tool 1 is a metallic thread fabric. The metallic cloth 3 is a material that has a mesh structure obtained by weaving metallic threads so as to intersect each other vertically and horizontally. A main component of the metallic threads is copper, for example. Also, there are cases where the metallic cloth 3 has a structure in which a film is affixed to a material made of metallic threads. This film is made of a resin material and is flexible. The metallic cloth 3 is conductive and flexible.

In the following description, the four outer edge portions of the metallic cloth 3 will be referred to as a first outer edge portion 31, a second outer edge portion 32, a third outer edge portion 33, and a fourth outer edge portion 34. The first outer edge portion 31 occupies a certain range that extends inward from, among the four outer edges of the metallic cloth 3, the outer edge that forms one end in the lengthwise direction of the electrical wires 9 and is an attachment target. The second outer edge portion 32 occupies a certain range that extends inward from the outer edge of the metallic cloth 3 on the side opposite to the first outer edge portion 31.

Also, the third outer edge portion 33 and the fourth outer edge portion 34 are, among the four outer edge portions of the metallic cloth 3, the outer edge portions other than the first outer edge portion 31 and the second outer edge portion 32. The third outer edge portion 33 and the fourth outer edge portion 34 can also be called the outer edge portions that form the two end portions of the metallic cloth 3 in the direction of surrounding the periphery of the electrical wires 9.

The metallic cloth 3 of the electromagnetic shielding tool 1 is joined to one of the two later-described bracket sets 2,4 in the first outer edge portion 31. Similarly, the metallic cloth 3 is joined to the other one of the two bracket sets 2,4 in the second outer edge portion 32. The metallic cloth 3 is electrically connected to the two metal casings 8 via the two bracket sets 2,4 respectively. The metallic cloth 3 is therefore in a casing ground state. Details of this will be described later.

Figure 2:
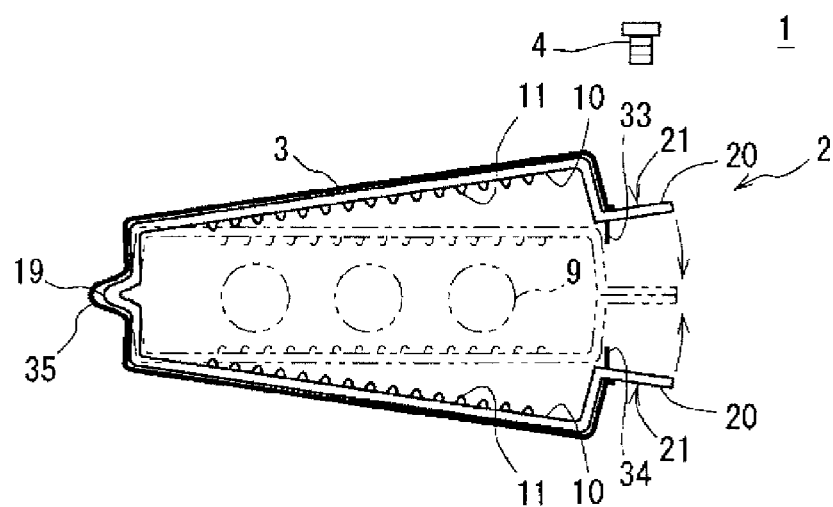
FIG. 2 is a front view of the electromagnetic shielding tool 1.

Also, in this embodiment, as shown in FIG. 2, the third outer edge portion 33 and the fourth outer edge portion 34 of the metallic cloth 3 are formed so as to extend slightly beyond the respective ends of the two elongated portions 10.

Bracket

The bracket body portion 2 of each of the two bracket sets 2,4 of the electromagnetic shielding tool 1 is a curved plate-shaped member made of a conductive material. The bracket body portion 2 is a member made of a metal such as a copper alloy, iron, or stainless steel. A plating layer is formed as necessary on the surface of the bracket body portion 2. The bracket body portion 2 is a member that relays the electrical connection between the metallic cloth 3 and the corresponding casing 8. The bracket body portion 2 is fixed to a portion of the corresponding metal casing 8.

Figure 3:
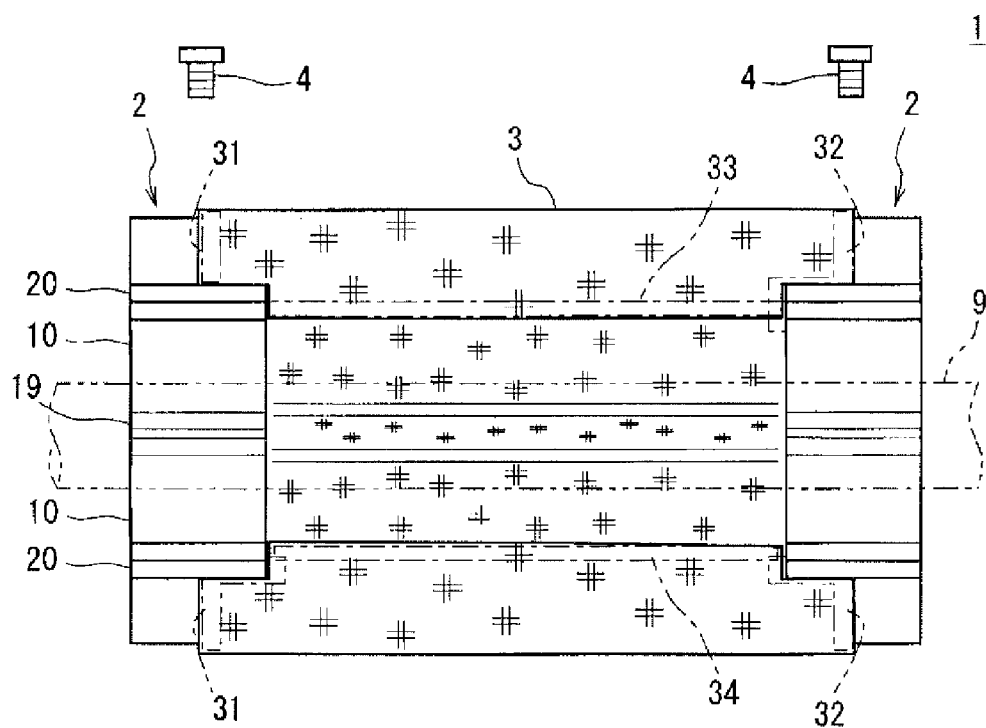
FIG. 3 is a side view of the electromagnetic shielding tool 1.

As shown in FIGS. 1 to 3, the bracket body portion 2 is configured by two elongated portions 10, a connecting portion 19 that connects one end of each of the two elongated portions 10, and two eave portions 20 that are respectively connected to the other ends of the two elongated portions 10.

Bracket Body Portion: Elongated Portion

The two elongated portions 10 are each a curved plate-shaped portion. The two elongated portions 10 are each formed in the shape of a half-ring that spans over multiple electrical wires 9 that are to be magnetically shielded. The two elongated portions 10 form a ring that surrounds the periphery of the electrical wires 9 by being combined with each other on two sides of the electrical wires 9.

In the example shown in FIG. 1, in each of the elongated portions 10, an intermediate portion that crosses over the electrical wires 9 is formed so as to be flat plate-shaped. However, the shapes of the elongated portions 10 differ according to the shape of the shield frame portion 81 of the casing 8 to which they are to be fixed.

Also, the two elongated portions 10 are joined to the metallic cloth 3 in a state of being arranged in series along an outer edge portion of the metallic cloth 3. The metallic cloth 3 and the elongated portions 10 are joined by welding, for example. The two elongated portions 10 of one of the two bracket sets 2,4 are joined to the metallic cloth 3 in a state of being arranged in series along the first outer edge portion 31 of the metallic cloth 3. Also, the two elongated portions 10 of the other one of the two bracket sets 2,4 are joined to the metallic cloth 3 in a state of being arranged in series along the second outer edge portion 32 of the metallic cloth 3.

In this embodiment, the two elongated portions 10 are formed along a route that turns back via the later-described connecting portion 19. For this reason, when the metallic cloth 3 is joined to the two elongated portions 10, it is held by the two elongated portions 10 so as to be in a state of turning back in an intermediate portion 35

Also, in each of the two bracket sets 2,4, the two elongated portions 10 are joined to the metallic cloth 3 on their outer surfaces that are on the sides opposite to the sides on which the two elongated portions 10 oppose each other. Also, multiple projections 11 are formed on the inner surfaces of the two elongated portions 10 that are on the sides on which the two elongated portions 10 oppose each other.

The projections 11 are formed by embossing. Multiple recessions 11x that respectively correspond to the projections 11 are thus formed in the outer surface of each of the two elongated portions 10.

Bracket Body Portion: Connecting Portion

Also, the connecting portion 19 is a turned-back plate-shaped portion, and is formed so as to be continuous with one end of each of the two elongated portions 10. In other words, the two elongated portions 10 and the connecting portion 19 are configured by one continuous member.

The connecting portion 19 is flexible in the direction in which the turn-back angle changes. As shown in FIG. 2, due to the flexibility of the connecting portion 19, the two elongated portions 10 can relatively pivot with the connecting portion 19 serving as the fulcrum. Accordingly, the bracket body portion 2 can undergo deformation to an open state in which the end portions are separated from each other and the interior is freed, and to a closed state in which the end portions are in contact with each other.

In FIG. 2, bracket body portion 2 in the open state is drawn with solid lines, and the bracket body portion 2 in the closed state is drawn with virtual lines (dashed double-dotted lines). When the two bracket body portions 2 are both in the open state, the metallic cloth 3 joined to the two bracket body portions 2 is also in an open state in which the third outer edge portion 33 and the fourth outer edge portion 34 are separated from each other. Also, when the two bracket body portions 2 are both in the closed state, the metallic cloth 3 joined to the two bracket body portions 2 forms a tube shape in which the third outer edge portion 33 and the fourth outer edge portion 34 are adjacent to each other.

As previously described, the third outer edge portion 33 and the fourth outer edge portion 34 of the metallic cloth 3 are formed so as to extend slightly beyond the end of each of the two elongated portions 10. For this reason, when the two bracket body portions 2 are in the closed state, the third outer edge portion 33 and the fourth outer edge portion 34 of the metallic cloth 3 are in contact with substantially no gap. The metallic cloth 3 thus becomes shaped as a tube having substantially no gap.

Bracket Body Portion: Eave Portion

The two eave portions 20 are each a flat plate-shaped portion that is formed so as to be continuous with the other end of the corresponding one of the two elongated portions 10 and protrude laterally from the corresponding one of the two elongated portions 10.

Accordingly, the bracket body portion 2 is one continuous metal member. The two elongated portions 10, the connecting portion 19 that connects one end of each of the elongated portions 10, and the two eave portions 20 that are respectively connected to the other ends of the two elongated portions 10 are formed in the bracket body portion 2. In other words, the two elongated portions 10 are configured by a continuous metal member together with the connecting portion 19, which is flexible and connects one end of each of the two elongated portions 10, and with the two eave portions 20 that are respectively continuous with the other ends of the two elongated portions 10.

The two eave portions 20 overlap each other when the two elongated portions 10 are combined to form a ring. Also, the two eave portions 20 are respectively provided with screw holes 21 to which the screw 4 is mounted. The through-holes are in communication with each other when the two eave portions 20 are in the overlapping state.

The bracket body portion 2 forms a ring shape when the two eave portions 20 overlap each other. Also, the two overlapped cave portions 20 are held in a combined state due to the screw 4 being mounted. Accordingly, the end portions of the two elongated portions 10 are coupled to each other, and the two elongated portions 10 are held in a ring shape.

The two eave portions 20 and the screw 4 in the bracket set 2,4 is one example of a coupling portion that couples the end portions of the two elongated portions 10 together and holds the two elongated portions 10 in a ring shape.

It is desirable that a thread ridge for threaded mounting with the screw 4 is formed on the inner edge portion of the screw hole 21 of each of the two eave portions 20. Accordingly, the screw 4 can be directly fastened to the eave portions 20, thus eliminating the need for a nut member for combining the two eave portions 20.

Of course a configuration is possible in which the coupling portion for holding the two elongated portions 10 in a ring shape is configured by the two eave portions 20 having through-holes formed therein, the screw 4, and a nut member to which the screw 4 is fastened. In this case, it is conceivable for the nut member to be fixed by, for example, being welded to one of the two overlapping eave portions 20 in advance.

As shown in FIGS. 1 and 3, the two bracket sets 2,4 each include the two elongated portions 10, the connecting portion 19 that connects one end of each of the two elongated portions 10, and the coupling portion 20,4 that couples the end portions of the two elongated portions 10. Also, the two bracket sets 2,4 each hold, among the four outer edge portions of the metallic cloth 3, the first outer edge portion 31 and the second outer edge portion 32 on the side opposite thereto in the shape of a ring that surrounds the periphery of the electrical wires 9.

Dimensions of Electromagnetic Shielding Tool

As shown in FIG. 4, in this embodiment, a length L1 of the elongated portions 10 in each of the two bracket sets 2,4 is longer than a length L2 of the third outer edge portion 33 and the fourth outer edge portion 34 of the metallic cloth 3.

The dimension configuration shown in FIG. 4 is an exemplary application of an electromagnetic shielding tool 1 according to this embodiment. This is a case in which the length L2 of the metallic cloth 3 is particularly short due to the two casings 8, to which the two bracket sets 2,4 are to be respectively fixed, being arranged in the vicinity of each other.

In another exemplary application of this embodiment, the shield frame portions 81 of the casings 8, to which the bracket sets 2,4 are to be fixed, have a large width, and therefore the elongated portions 10 of the bracket sets 2,4 are correspondingly formed so as to be long.

Structure of the Electromagnetic Shielding Tool Fixed to the Casing

Figure 5:
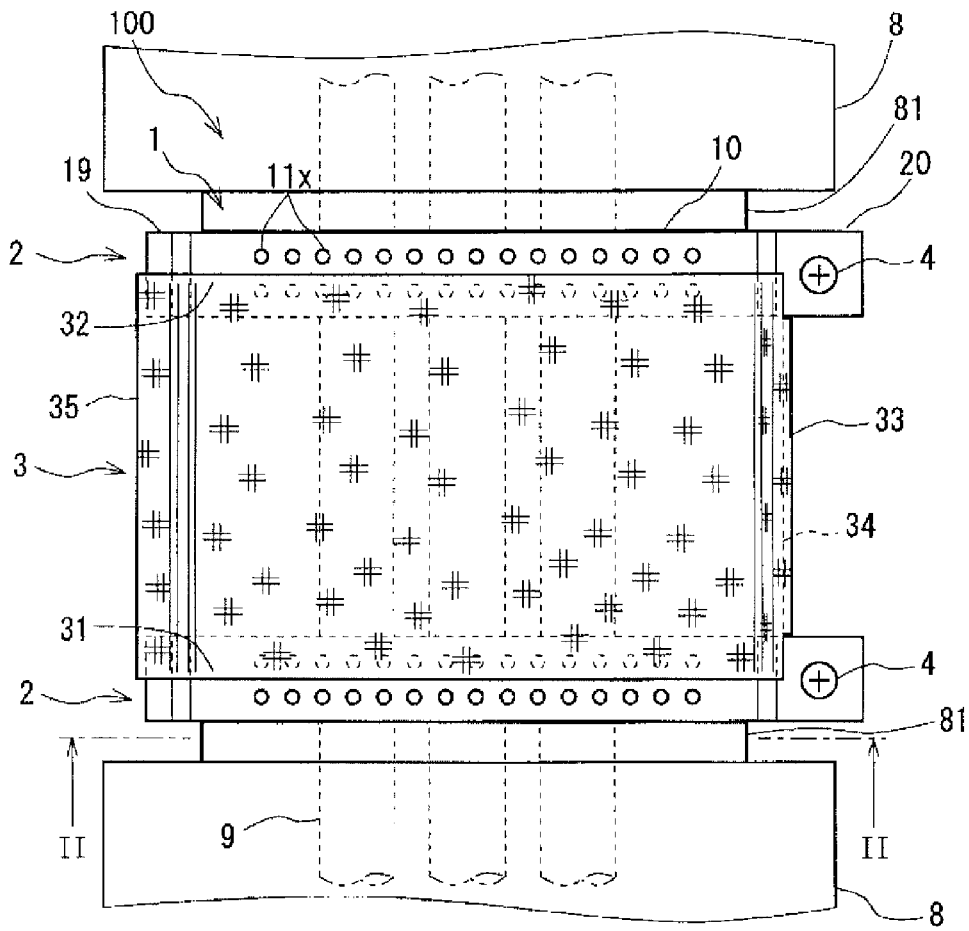
FIG. 5 is a plan view of the wire harness 100 in a state of being attached to casings.
Figure 6:
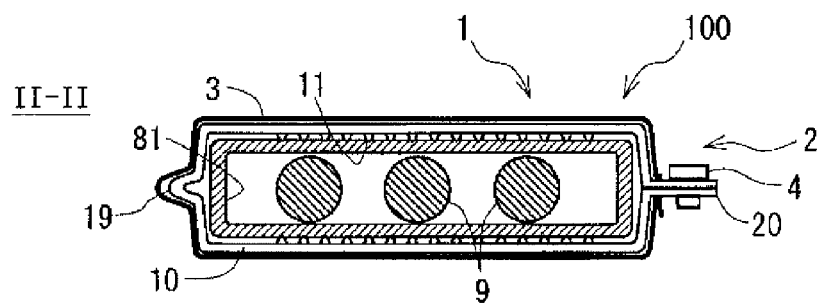
FIG. 6 is a cross-sectional view of the wire harness 100 in the state of being attached to a casing.

Next, the structure of the electromagnetic shielding tool 1 fixed to the casings 8 will be described with reference to FIGS. 5 and 6. Note that FIG. 5 is a plan view of the wire harness 100 in a state of being attached to the casings 8. FIG. 6 is a cross-sectional view of the wire harness 100 in the state of being attached to a casing 8. The cross-sectional view of FIG. 6 is a cross-sectional view taken along a plane II-II shown in FIG. 5.

As shown in FIGS. 5 and 6, the electrical wires 9 of the wire harness 100 are laid out from outside the metal casings 8 to the interior of the casings 8 via openings in the casings 8. Also, the opening for electrical wire introduction of each of the casings 8 is provided with the metallic shield frame portion 81 that surrounds the opening.

As shown in FIGS. 5 and 6, one of the two bracket sets 2,4 is fixed to the shield frame portion 81 of the casing 8 that houses the device to which one end portion of each of the electrical wires 9 is to be connected, and the other one of the two bracket sets 2,4 is fixed to the shield frame portion 81 of the casing 8 that houses the device to which the other end portion of each of the electrical wires 9 is to be connected.

More specifically, first, the two bracket body portions 2 in the open state are respectively placed over the outer sides of the shield frame portions 81 of the two casings 8, and the metallic cloth 3 likewise in the open state (non-tube-shaped body) is placed over a portion of the electrical wires 9 that extends between the two casings 8.

Next, the two bracket body portions 2 are respectively put in the closed state on the outer sides of the shield frame portions 81. Accordingly, the two elongated portions 10 of each of the two bracket body portions 2 clamp the corresponding shield frame portion 81, and the metallic cloth 3 becomes shaped as a tube that surrounds the periphery of the electrical wires 9. At this time, the projections 11 on the two elongated portions 10 come into forcible contact with the outer surface of the shield frame portion 81. Specifically, the force with which the two elongated portions 10 clamp the shield frame portion 81 is concentrated at the vertex portions of the projections 11.

Lastly, the two screws 4 are respectively inserted into the screw holes 21 in the two overlapping eave portions 20 of the two respective bracket body portions 2, and the pairs of eave portions 20 are held in the overlapping state by the screws 4. Accordingly, the two bracket body portions 2 are each held in the closed state and fixed to the corresponding shield frame portion 81.

When the two bracket sets 2,4 are respectively fixed to the shield frame portions 81 of the two casings 8, the two bracket body portions 2 are respectively electrically connected to the two casings 8. For this reason, the conductive metallic cloth 3 joined to each of the two bracket body portions 2 is also electrically connected to each of the two casings 8.

Due to the metallic cloth 3 being electrically connected to the casings 8 in the state of surrounding the periphery of the electrical wires 9, the metallic cloth 3 blocks electromagnetic noise directed toward the electrical wires 9.

Effects

In the electromagnetic shielding tool 1, the two elongated portions 10 configuring each of the two bracket sets 2,4 are fixed to the shield frame portion 81 of the corresponding metal casing 8. These two elongated portions 10 relay the electrical connection between the metallic cloth 3 and the casing 8. The metallic cloth 3 is electrically connected to the metal casings 8 via the two bracket sets 2,4, and is in a casing ground state.

In the electromagnetic shielding tool 1, the two elongated portions 10 made of a conductive material are combined with each other on two sides of the electrical wires 9 and held in a ring shape. Accordingly, the metallic cloth 3 joined to the two elongated portions 10 forms a tube that surrounds the periphery of the electrical wires 9.

In other words, the electromagnetic shielding tool 1 is not a member that forms a tube in advance, and therefore post-provision of the electromagnetic shielding tool 1 to the electrical wires 9 is possible. More specifically, the electromagnetic shielding tool 1 can be mounted to the electrical wires 9 after connectors or the like have been attached to the end portions. Furthermore, the electromagnetic shielding tool 1 can be mounted to the electrical wires 9 after they have been laid out from outside the casings 8 to the inside.

Also, a metallic cloth 3 of a size for surrounding the periphery of the electrical wires 9 with no excess or deficiency may be employed in the electromagnetic shielding tool 1. In this case, the application of the electromagnetic shielding tool 1 is not accompanied by an increase in layout space, weight, or manufacturing cost.

Also, in the electromagnetic shielding tool 1, the two elongated portions 10 configuring each of the two bracket sets 2,4 are coupled by the coupling portion configured by the cave portions 20 and the screw 4 in the state of forming a ring while clamping the shield frame portion 81 of the corresponding casing 8. Furthermore, the coupling portion holds the two combined elongated portions 10 in the ring shape, and therefore the metallic cloth 3 joined to the two elongated portions 10 is held in the shape of a tube that surrounds the periphery of the electrical wires 9.

In other words, the two bracket sets 2,4 play the role of holding the metallic cloth 3 in a tube shape and the role of maintaining the electrical connection between the metallic cloth 3 and the shield frame portions 81 of the casings 8. Accordingly, if the electromagnetic shielding tool 1 is applied, parts management is simplified and the man-hours required in handling is reduced compared to the case where multiple parts are handled due to the application of conventional braided wires and crimp fittings.

Also, since the metallic cloth 3 is flexible, the electromagnetic shielding tool 1 can also surround the periphery of electrical wires 9 that extend along a curved path.

Note that since the surface of the metallic cloth 3 is a surface having minute recessions and projections formed by thin metal wires similarly to the surface of a braided wire, the frictional resistance is very low. For this reason, when the metallic cloth 3 is fixed due to being clamped between the shield frame portions 81 of the casings and another fixing member such as a crimp fitting, the metallic cloth 3 easily slips off of the shield frame portions 81.

However, in the electromagnetic shielding tool 1 according to this embodiment, the metallic cloth 3 is joined to the elongated portions 10 of the two bracket sets 2,4 in advance. For this reason, the two bracket sets 2,4 can be directly fixed to the shield frame portions 81 without interposing the metallic cloth 3 therebetween. Accordingly, the problem of the electromagnetic shielding tool 1 detaching from the shield frame portions 81 of the casings 8 is prevented.

Also, in the electromagnetic shielding tool 1, the frictional resistance of the elongated portions 10 and the shield frame portions 81 increases due to the effect of the projections 11 formed on the inner surfaces of the elongated portions 10. This increases the retaining force of the bracket sets 2,4 with respect to the shield frame portions 81. As a result, the problem of the electromagnetic shielding tool 1 detaching from the shield frame portions 81 of the casings 8 can be further suppressed.

Also, if the two casings 8, to which the two bracket sets 2,4 are to be respectively fixed, are arranged in the vicinity of each other, the length L1 of the elongated portions 10 and the length L2 of the third outer edge portion 33 and the fourth outer edge portion 34 of the metallic cloth 3 may be in the relationship L1>L2 as shown in FIG. 4. Even in such a case where there is little leeway in the workspace, the electromagnetic shielding tool 1 does not require the position of the metallic cloth 3 to be shifted to one side in the lengthwise direction of the electrical wires 9 during attachment to the casings 8. This makes it possible to attach the electromagnetic shielding tool 1 more easily.

In other embodiments, the shield frame portions 81 of the casings 8, to which the bracket sets 2,4 are to be fixed, have a large width, and therefore the length L1 of the elongated portions 10 is correspondingly long so as to be in the relationship L1>L2. Even in this case, if the electromagnetic shielding tool 1 including the bracket sets 2,4 that can be directly fixed to the shield frame portions 81 is used, the effect of suppressing detachment from the shield frame portions 81 of the casings 8 is more remarkable.

Also, in the electromagnetic shielding tool 1 according to this embodiment, the two elongated portions 10 of each of the two bracket sets 2,4 are configured by continuous members together with the connecting portion 19. For this reason, if the electromagnetic shielding tool 1 is applied, there is a reduction in the number of parts compared to the case where the two elongated portions 10 are separate members. This makes it possible to reduce the man-hours associated with attachment to the casings 8.

Also, in the electromagnetic shielding tool 1 according to this embodiment, the metallic cloth 3 is joined to the outer surfaces of the elongated portions 10. In this case, the metallic cloth 3 is not sandwiched between the elongated portions 10 and the shield frame portions 81 of the casings 8. For this reason, the portions of the elongated portions 10 that come into contact with the shield frame portions 81 and the portions of the elongated portions 10 that are joined to the metallic cloth 3 do not need to be formed separately in order to prevent clamping of the metallic cloth 3. This makes it possible to reduce the size of the elongated portions 10 (the bracket body portions 2).

Second Embodiment

Figure 7:
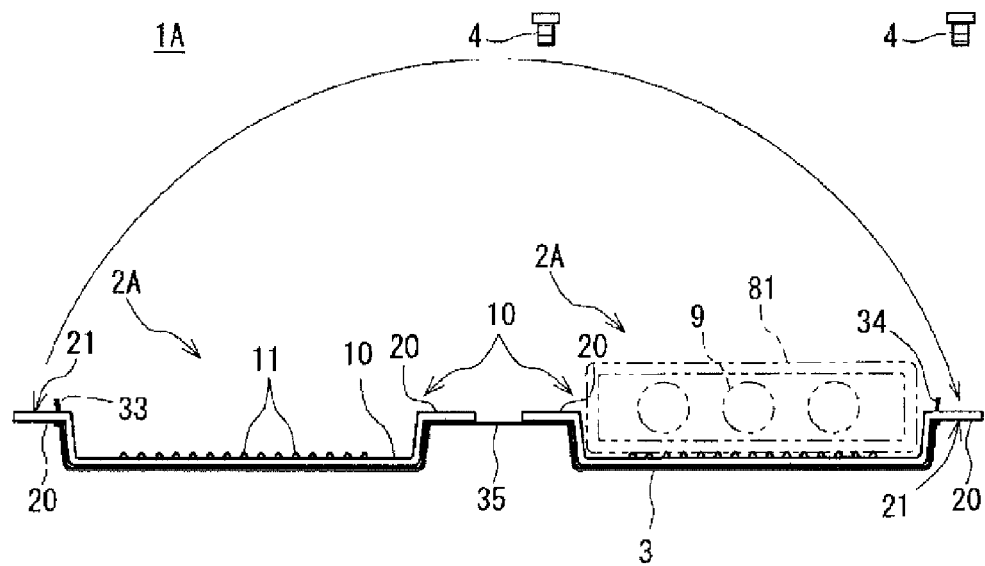
FIG. 7 is a front view of a pre-attachment state of an electromagnetic shielding tool 1A according to a second embodiment of this disclosure.
Figure 8:
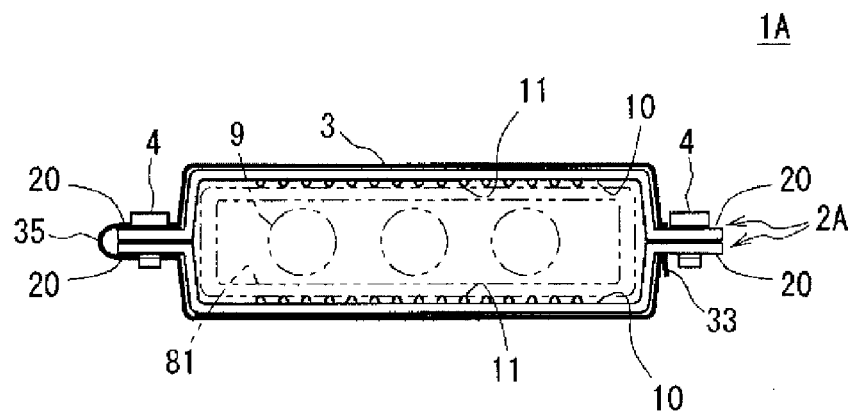
FIG. 8 is a front view of a first post-attachment state of the electromagnetic shielding tool 1A.
Figure 9:
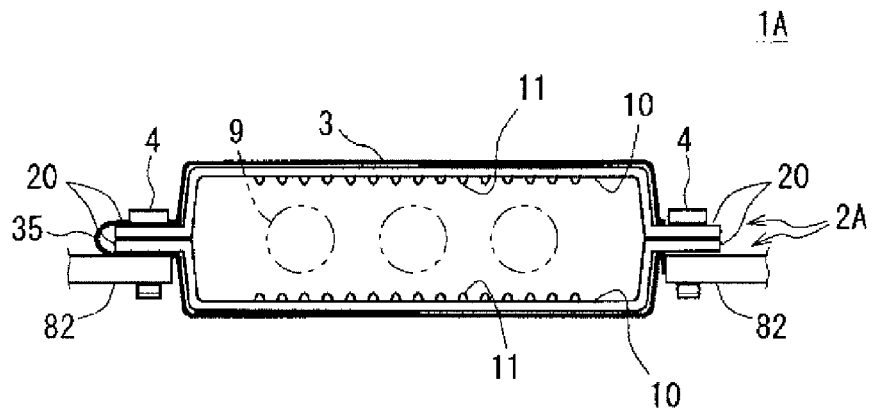
FIG. 9 is a front view of a second post-attachment state of the electromagnetic shielding tool 1A.

Next, the configuration of an electromagnetic shielding tool 1A according to a second embodiment will be described with reference to FIGS. 7 to 9. This electromagnetic shielding tool 1A is different from the electromagnetic shielding tool 1 shown in FIGS. 1 to 6 in that the two elongated portions 10 are configured as separate members. In FIGS. 7 to 9, constituent elements that are the same as constituent elements shown in FIGS. 1 to 6 have been given the same reference signs. The following describes only differences in the electromagnetic shielding tool 1A from the electromagnetic shielding tool 1.

FIG. 7 is a front view of a state before attachment of the electromagnetic shielding tool 1A, FIG. 8 is a front view of a first post-attachment state of the electromagnetic shielding tool 1A, and FIG. 9 is a front view of a second post-attachment state of the electromagnetic shielding tool 1A. Note that in FIGS. 7 and 8, the electrical wires 9 and the shield frame portion 81 of the casing 8 are drawn with virtual lines (dashed double-dotted lines). Similarly, the electrical wires 9 are drawn with virtual lines (dashed double-dotted lines) in FIG. 9.

The electromagnetic shielding tool 1A includes the metallic cloth 3 and two bracket sets 2A,4. The two bracket sets 2A,4 are each configured by two bracket body portions 2A and two screws 4. The two bracket body portions 2A each have one elongated portion 10 formed in the shape of a half-ring that spans over the electrical wires 9, and two eave portions 20 formed so as to be continuous with respective ends of the elongated portion 10.

Specifically, the electromagnetic shielding tool 1A includes one metallic cloth 3 and four bracket body portions 2A. Also, the elongated portions 10 of the electromagnetic shielding tool 1A are respectively configured as portions of the four bracket body portions 2A that are each an independent member. Also, in the electromagnetic shielding tool 1A as well, the two elongated portions 10 are joined to the metallic cloth 3 in a state in which the elongated portions 10 are arranged in series along an outer edge portion of the metallic cloth 3.

More specifically, the two elongated portions 10 of one of the two bracket sets 2A,4 are joined to the metallic cloth 3 in a state of being arranged in series along the first outer edge portion 31 of the metallic cloth 3. Also, the two elongated portions 10 of the other one of the two bracket sets 2A,4 are joined to the metallic cloth 3 in a state of being arranged in series along the second outer edge portion 32 of the metallic cloth 3. The metallic cloth 3 and the elongated portions 10 are joined by welding, for example.

In the electromagnetic shielding tool 1A, when the two bracket body portions 2A are combined with each other on two sides of the electrical wires 9, the two elongated portions 10 form a ring shape, and the metallic cloth 3 turns back in an intermediate portion 35 between the portions respectively joined to the two bracket body portions 2A.

Also, the two bracket body portions 2A are combined in a state in which the two elongated portions 10 clamp the shield frame portion 81 of the casing 8. Accordingly, the metallic cloth 3 joined to the two bracket body portions 2 forms a tube shape in which the third outer edge portion 33 and the fourth outer edge portion 34 are adjacent to each other.

As shown in FIG. 8, the two bracket body portions 2A of each of the two bracket sets 2A,4 are combined in a state of sandwiching the shield frame portion 81 of the casing 8 between them. Accordingly, the two elongated portions 10 clamp the shield frame portion 81, and the metallic cloth 3 forms a tube that surrounds the periphery of the electrical wires 9. Note that the effect of the projections 11 is the same as previously described.

Furthermore, the four screws 4 are respectively inserted into the screw holes 21 in the two overlapping eave portions 20 at respective ends of the two pairs of bracket body portions 2A, and the pairs of eave portions 20 are held in the overlapping state by the screws 4. Accordingly, the two pairs of bracket body portions 2A are each held in the shape of a ring that sandwiches the shield frame portion 81, and are fixed to the shield frame portion 81.

Incidentally, the electromagnetic shielding tool 1A is normally fixed to the shield frame portion 81 according to the aspect shown in FIG. 8, but it is also conceivable for it to be fixed to a portion of the casing 8 according to another aspect as shown in FIG. 9, for example.

In the example shown in FIG. 9, a pair of bracket body portions 2A is combined on two sides of the electrical wires 9, and eave portions 20 at two locations at respective ends thereof are fixed, by screws 4, to support plates 82 formed so as to protrude from the casing 8. A coupling structure for coupling the two elongated portions 10 is provided at two locations at respective ends of the bracket body portions 2A, and therefore the electromagnetic shielding tool 1A can also be fixed according to the aspect shown in FIG. 9. Note that the projections 11 on the elongated portions 10 are not necessary in this case.

Third Embodiment

Figure 10:
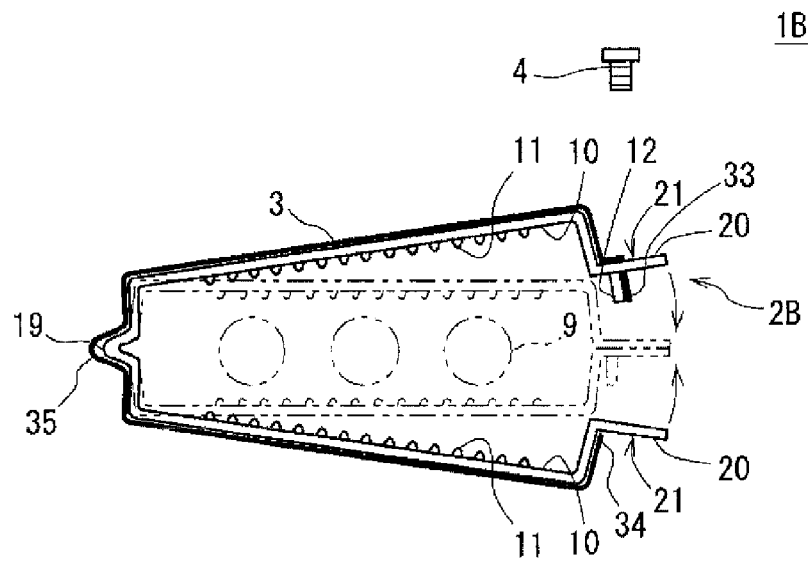
FIG. 10 is a front view of an electromagnetic shielding tool 1B according to a third embodiment of this disclosure.
Figure 11:
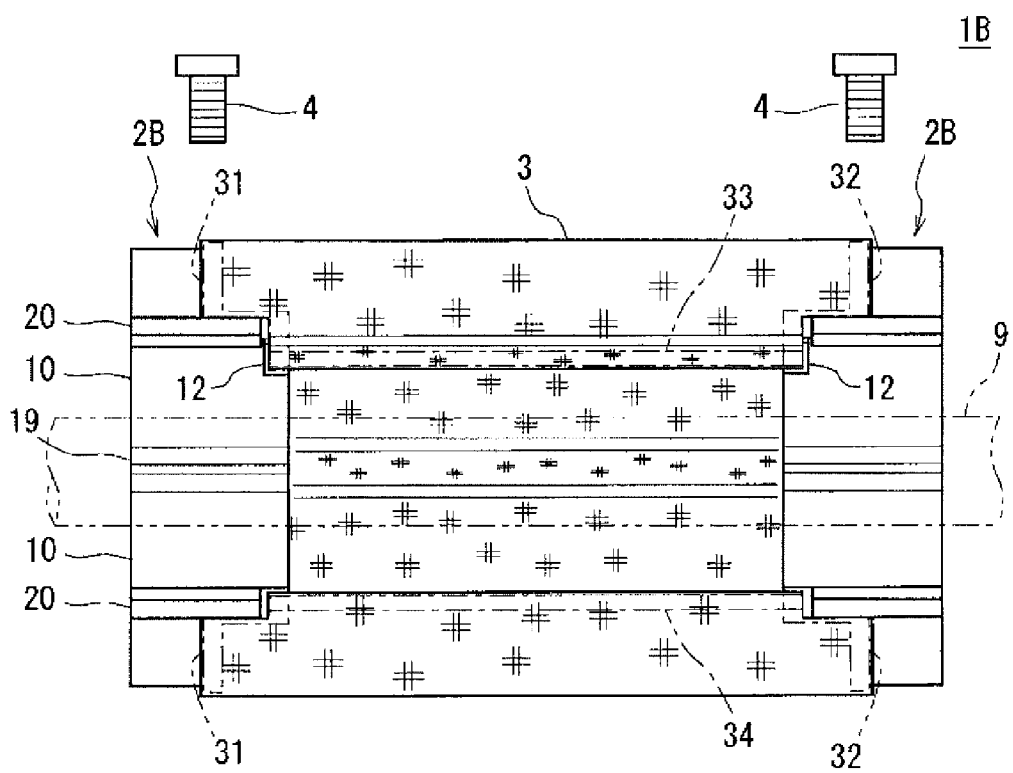
FIG. 11 is a side view of the electromagnetic shielding tool 1B.
Figure 12:
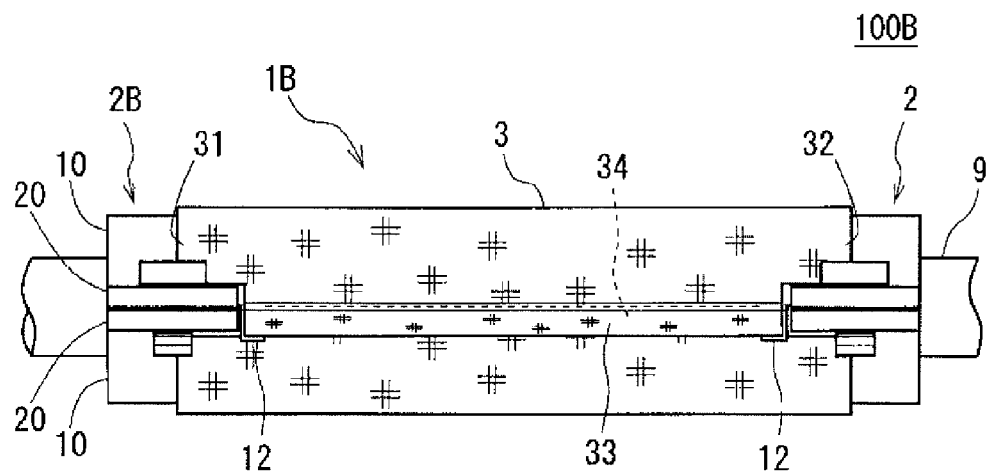
FIG. 12 is a side view of a wire harness 100B according to the third embodiment of this disclosure.

Next, an electromagnetic shielding tool 1B and a wire harness 100B including the same according to a third embodiment will be described with reference to FIGS. 10 to 12. This electromagnetic shielding tool 1B is different from the electromagnetic shielding tool 1 shown in FIGS. 1 to 6 in that the end portion of one of the two elongated portions 10 has a different structure. In FIGS. 10 to 12, constituent elements that are the same as constituent elements shown in FIGS. 1 to 6 have been given the same reference signs. The following describes only differences in the electromagnetic shielding tool 1B from the electromagnetic shielding tool 1.

FIG. 10 is a front view of the electromagnetic shielding tool 1B, FIG. 11 is a side view of the electromagnetic shielding tool 1B, and FIG. 12 is a side view of the wire harness 100B. Note that in FIG. 10, the electrical wires 9 and the shield frame portion 81 of the casing 8 are drawn with virtual lines (dashed double-dotted lines). Similarly, the electrical wires 9 are drawn with virtual lines (dashed double-dotted lines) in FIG. 11.

The electromagnetic shielding tool 1B includes two bracket sets 2B,4 similarly to the electromagnetic shielding tool T. In each of the two bracket sets 2B,4, the end portion of one elongated portion 10 out of the two elongated portions 10 is provided with an extension portion 12 that protrudes farther toward the other elongated portion 10 than the eave portion 20 does so as to overlap with the end portion of the other elongated portion 10. Also, the metallic cloth 3 is formed large enough to extend to the extension portion 12 of the elongated portion 10. The first outer edge portion 31 and the second outer edge portion 32 of the metallic cloth 3 are respectively joined to the elongated portions 10 in a range that extends to the extension portions 12 of the elongated portions 10.

Also, in each of the two bracket sets 2B,4, the coupling portion, which is configured by the eave portions 20 and the screw 4, couples the two elongated portions 10 in a state in which the respective end portions of the two elongated portions 10 joined to the metallic cloth 3 overlap each other. Here, one of the end portions of the two elongated portions 10 is the extension portion 12.

As shown in FIG. 12, in the electromagnetic shielding tool 1B, the metallic cloth 3 is held in the shape of a tube that has substantially no gap and overlaps itself in the third outer edge portion 33 and the fourth outer edge portion 34 that form the two end portions in the direction of surrounding the periphery of the electrical wires 9. For this reason, electromagnetic noise is more reliably blocked, and stable shielding performance is obtained.

Fourth Embodiment

Figure 13:
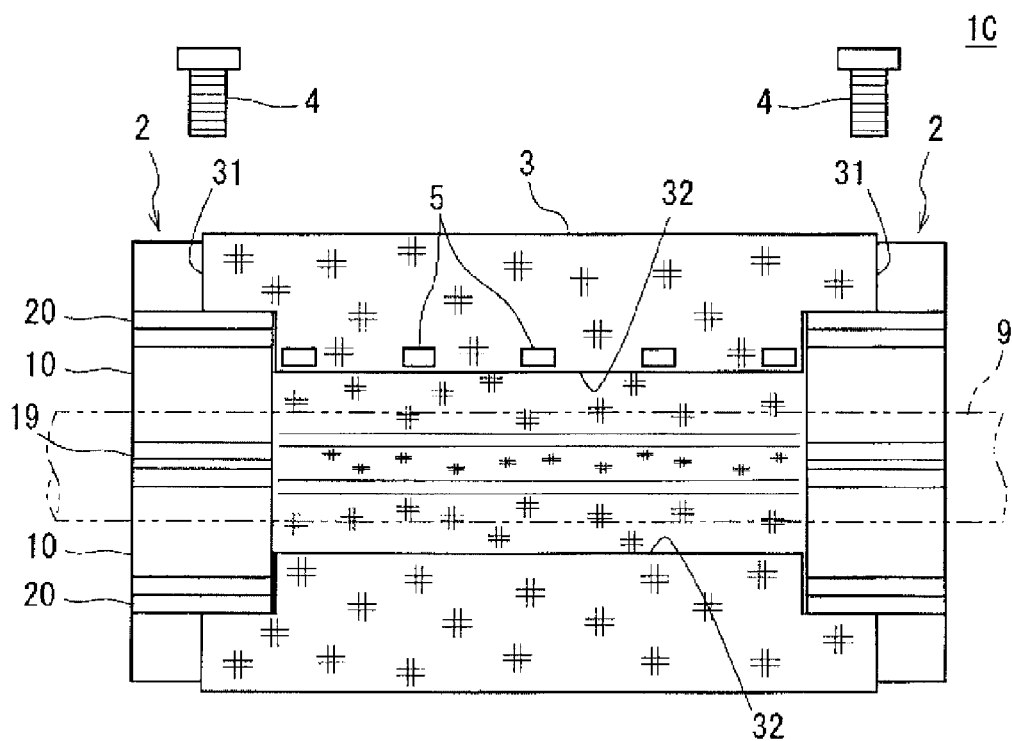
FIG. 13 is a side view of an electromagnetic shielding tool 1C according to a fourth embodiment of this disclosure.
Figure 14:
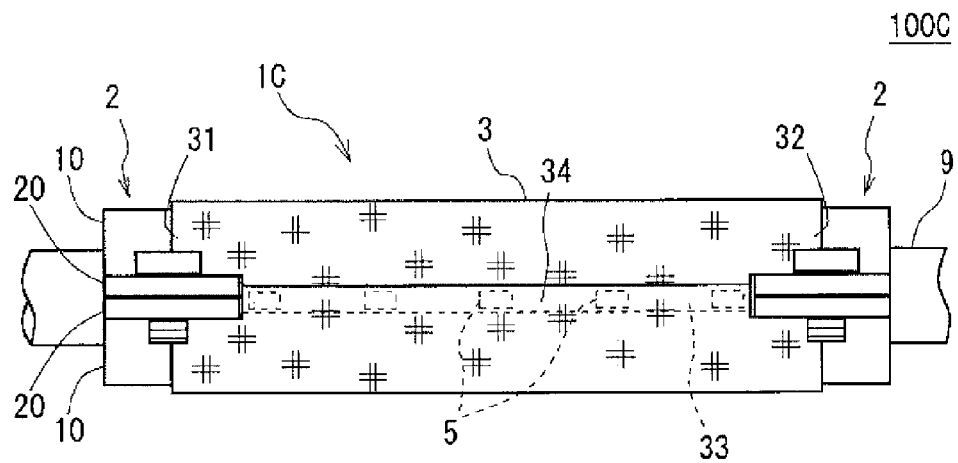
FIG. 14 is a side view of a wire harness 100C according to the fourth embodiment of this disclosure.

Next, an electromagnetic shielding tool 1C and a wire harness 100C including the same according to a fourth embodiment will be described with reference to FIGS. 13 and 14. This electromagnetic shielding tool 1C has a configuration in which metallic cloth joining members 5 have been added to the electromagnetic shielding tool 1 shown in FIGS. 1 to 6. In FIGS. 13 and 14, constituent elements that are the same as constituent elements shown in FIGS. 1 to 6 have been given the same reference signs. The following describes only differences in the electromagnetic shielding tool 1C from the electromagnetic shielding tool 1.

FIG. 13 is a side view of the electromagnetic shielding tool 1C, and FIG. 14 is a side view of the wire harness 100C that includes the electromagnetic shielding tool 1C and electrical wires 9. Note that the electrical wires 9 are drawn with virtual lines (dashed double-dotted lines) in FIG. 13. Note that FIG. 13 shows the electromagnetic shielding tool 1C in the open state.

The metallic cloth joining members 5 included in the electromagnetic shielding tool 1C are plate-shaped metal members joined by welding to the third outer edge portion 33 and the fourth outer edge portion 34 of the metallic cloth 3. In the electromagnetic shielding tool 1C in the open state, the metallic cloth joining members 5 are joined to one of the third outer edge portion 33 and the fourth outer edge portion 34 of the metallic cloth 3. The electromagnetic shielding tool 1C is then put in the closed state and attached to the electrical wires 9 and the shield frame portions 81 of the casings 8. Thereafter, the metallic cloth joining members 5 are joined by welding to the remaining one of the third outer edge portion 33 and the fourth outer edge portion 34 of the metallic cloth 3.

Also, the third outer edge portion 33 of the metallic cloth 3 is joined to one of the surfaces of the metallic cloth joining members 5, and the fourth outer edge portion 34 of the metallic cloth 3 is joined to another one of the surfaces of the metallic cloth joining members 5. Accordingly, in a state in which both the third outer edge portion 33 and the fourth outer edge portion 34 of the metallic cloth 3 are joined to the metallic cloth joining members 5, the third outer edge portion 33 and the fourth outer edge portion 34 are held in an overlapping state.

Joining portions of the metallic cloth 3 together by welding or the like is difficult. However, by interposing the metallic cloth joining members 5 made of metal between two edge portions of the metallic cloth 3, it is easy to join the two edge portions of the metallic cloth 3 in an overlapping state by welding.

When the electromagnetic shielding tool 1C is applied, the metallic cloth 3 is formed into a tube that has no gap in conjunction with the metallic cloth joining members 5. For this reason, electromagnetic noise is more reliably blocked, and stable shielding performance is obtained.

Also, multiple metallic cloth joining members 5 are joined to the third outer edge portion 33 and the fourth outer edge portion 34 of the metallic cloth 3 at intervals. For this reason, the flexibility of the metallic cloth 3 is not impaired. The electromagnetic shielding tool 1C can therefore surround the periphery of electrical wires 9 that extend along a curved path.

Fifth Embodiment

Next, an electromagnetic shielding tool 1D and a wire harness 100D including the same according to a fifth embodiment will be described with reference to FIGS. 15 to 19. This electromagnetic shielding tool 1D is different from the electromagnetic shielding tool 1A shown in FIGS. 7 to 9 with respect to the structure of the joining of the metallic cloth and the elongated portions of the bracket body portions. Also, the wire harness 100D includes the electromagnetic shielding tool 1D and multiple electrical wires 9, and further includes an electrical wire holding member 91 that holds the end portions of the electrical wires 9 in a certain positional relationship. In FIGS. 15 to 19, constituent elements that are the same as constituent elements shown in FIGS. 1 to 14 have been given the same reference signs. The following describes only differences in the electromagnetic shielding tool 1D from the electromagnetic shielding tool 1A.

Figure 15:
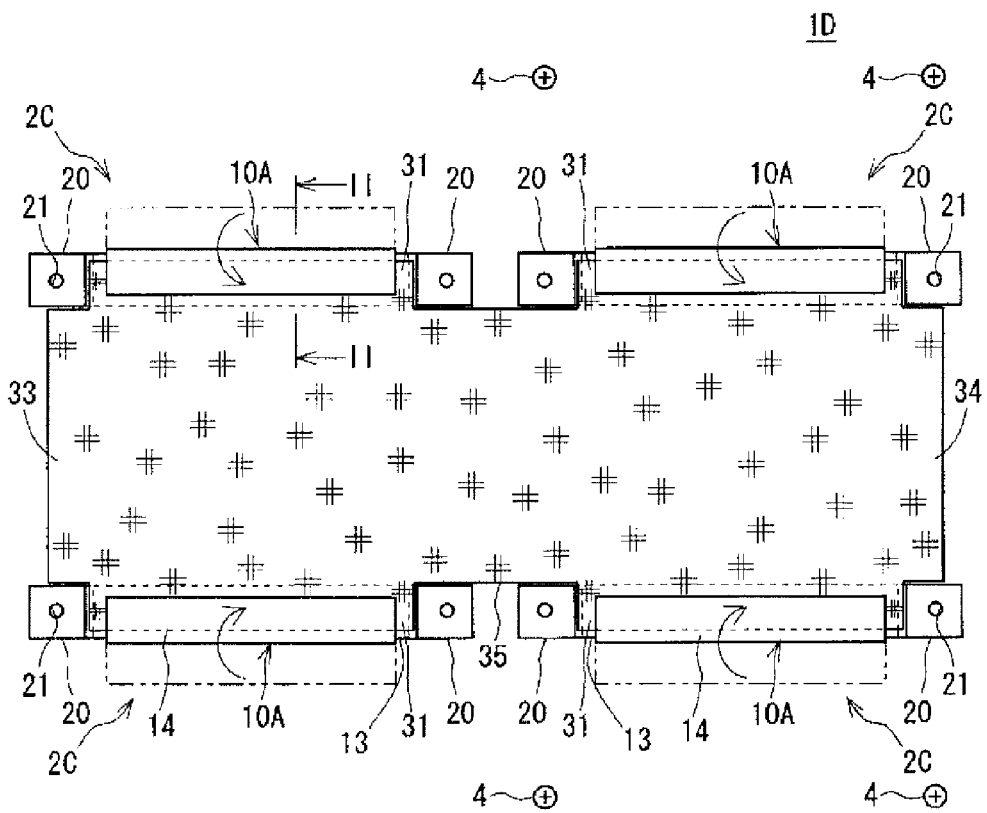
FIG. 15 is a plan view of an electromagnetic shielding tool 1D according to a fifth embodiment of this disclosure.
Figure 16:
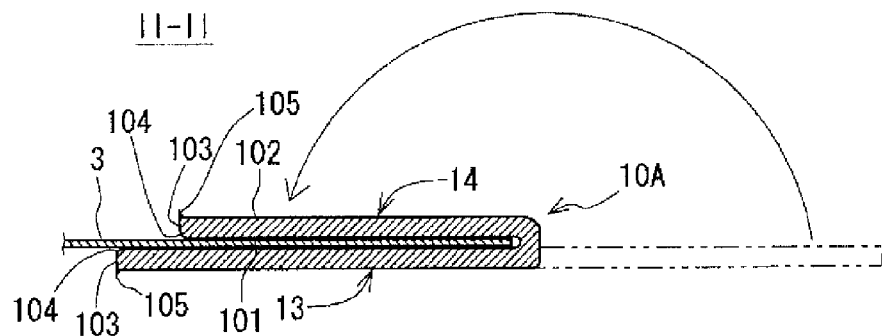
FIG. 16 is a cross-sectional view of a joining portion (pressure joining portion) of an elongated portion and a metallic cloth in the electromagnetic shielding tool 1D.
Figure 17:
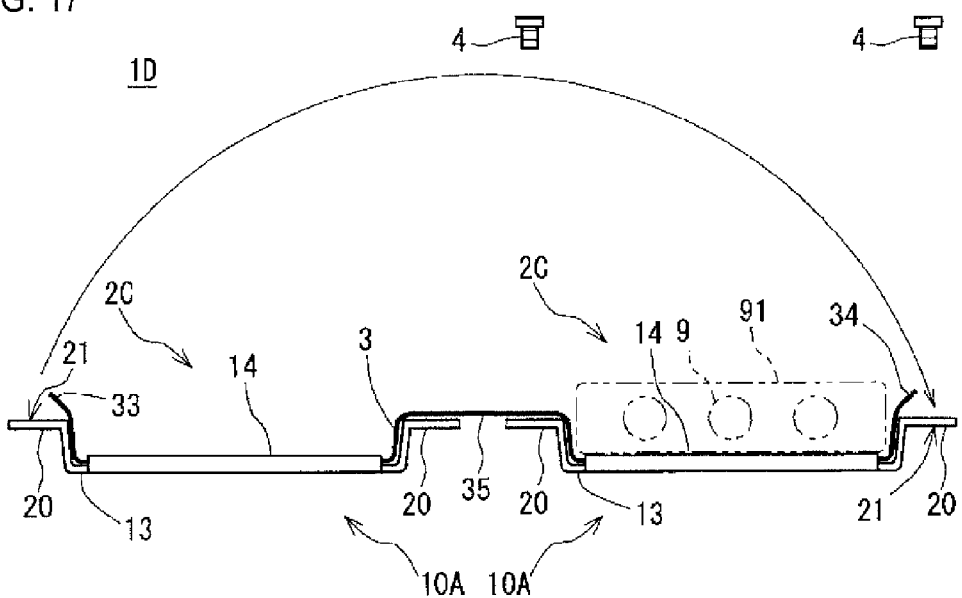
FIG. 17 is a front view of the electromagnetic shielding tool 1D.
Figure 18:
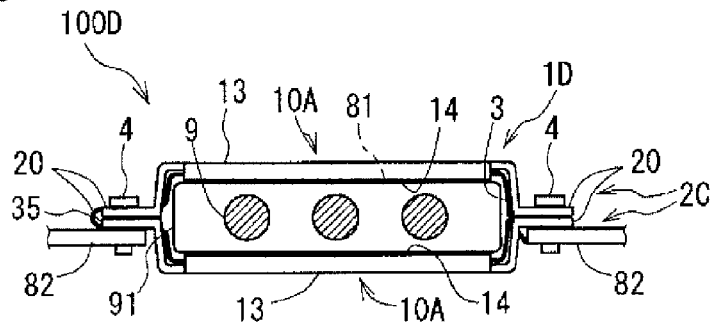
FIG. 18 is a front view of a wire harness 100D according to the fifth embodiment of this disclosure.
Figure 19:
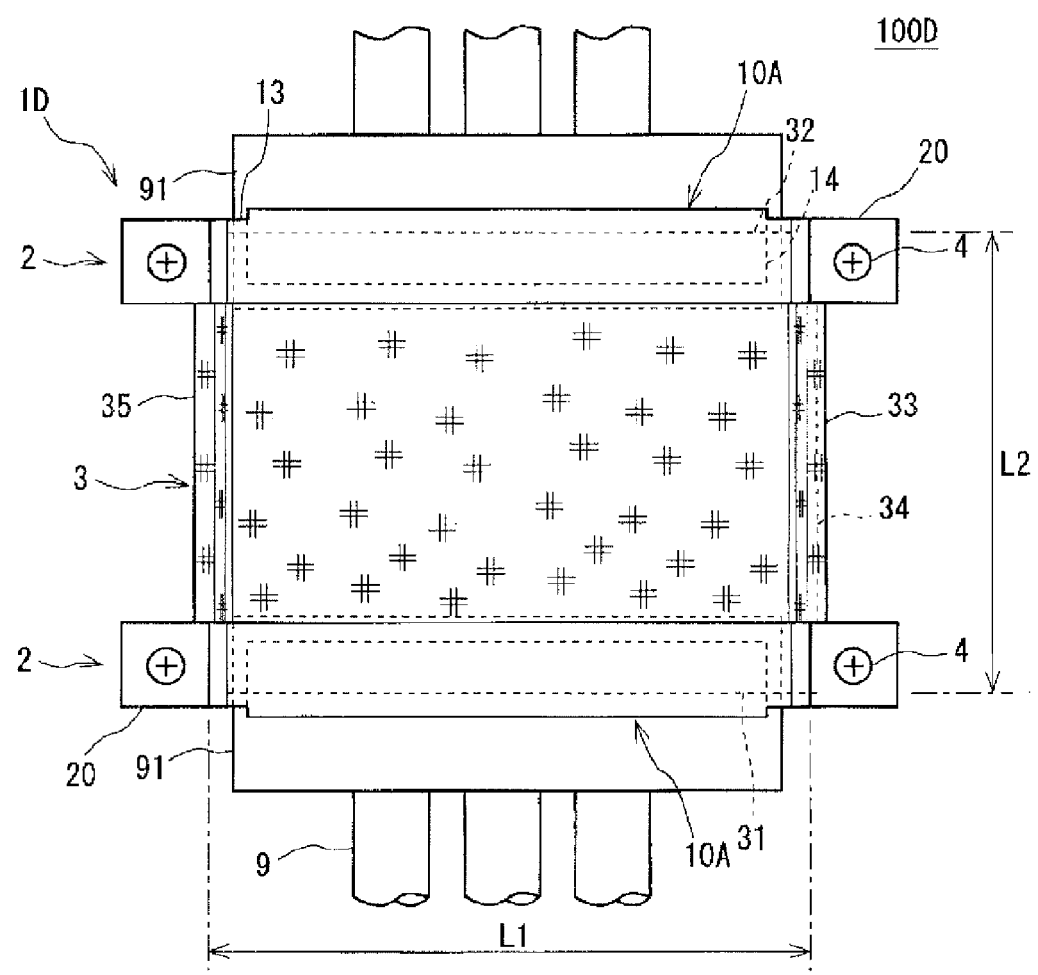
FIG. 19 is a plan view of the wire harness 100D.

FIG. 15 is a plan view of the electromagnetic shielding tool 1D, FIG. 16 is a cross-sectional view of the joining portion (pressure joining portion) of an elongated portion and the metallic cloth in the electromagnetic shielding tool 1D, and FIG. 17 is a front view of the electromagnetic shielding tool 1D. Here, FIG. 16 is a view taken along a sectional plane II-II in FIG. 15. Also, FIG. 18 is a front view of the wire harness 100D, and FIG. 19 is a plan view of the wire harness 100D. Note that the electrical wires 9 and the electrical wire holding member 91 are drawn with virtual lines (dashed double-dotted lines) in FIG. 17.

As shown in FIG. 15, the electromagnetic shielding tool 1D includes the metallic cloth 3 and two bracket sets 20,4 similar to the electromagnetic shielding tools 1 and 1A. The two bracket sets 20,4 are each configured by two bracket body portions 2C and two screws 4. The two bracket body portions 2C each have one elongated portion 10A formed in the shape of a half-ring that spans over the electrical wires 9, and two eave portions 20 formed so as to be continuous with respective ends of the elongated portion 10A.

Specifically, the electromagnetic shielding tool 1D includes one metallic cloth 3 and four bracket body portions 2C. Also, the elongated portions 10A of the electromagnetic shielding tool 1C are respectively configured as portions of the four bracket body portions 2C. The four bracket body portions 2C are each an independent member. Also, in the electromagnetic shielding tool 1C as well, the two elongated portions 10A are joined to the metallic cloth 3 in a state in which the elongated portions 10A are arranged in series along an outer edge portion of the metallic cloth 3.

More specifically, the two elongated portions 10A of one of the two bracket sets 2C,4 are joined to the metallic cloth 3 in a state of being arranged in series along the first outer edge portion 31 of the metallic cloth 3. Also, the two elongated portions 10A of the other one of the two bracket sets 2A,4 are joined to the metallic cloth 3 in a state of being arranged in series along the second outer edge portion 32 of the metallic cloth 3.

In each of the bracket body portions 2C, the elongated portions 10A are each joined to the metallic cloth 3 by being pressure-joined to the outer edge portion of the metallic cloth 3. Specifically, each of the two elongated portions 10A of one of the two bracket body portions 2C is joined to the metallic cloth 3 by being pressure-joined to the first outer edge portion 31 of the metallic cloth 3. Similarly, each of the two elongated portions 10A of the other one of the two bracket body portions 2C is joined to the metallic cloth 3 by being pressure-joined to the third outer edge portion 33 of the metallic cloth 3.

Each of the elongated portions 10A has the following structure in order to be pressure-joined to an outer edge portion of the metallic cloth 3. Specifically, each of the elongated portions 10A has a base portion 13 and a turn-back portion 14 that is continuous with the base portion 13 as shown in FIGS. 15 to 17.

The base portion 13 of the elongated portion 10A is a portion that extends along the outer edge portion of the metallic cloth 3 (the first outer edge portion 31 or the second outer edge portion 32). The turn-back portion 14 that is continuous with the base portion 13 is a portion where the base portion 13 is turned back so as to overlap itself. The outer edge portion of the metallic cloth 3 is clamped between the turn-back portion 14 and the base portion 13. The elongated portion 10A is pressure-joined to the outer edge portion of the metallic cloth 3 by clamping the outer edge portion of the metallic cloth 3 between the base portion 13 and the turn-back portion 14. Note that the turn-back portions 14 in the state before turn-back are drawn with virtual lines (dashed double-dotted lines) in FIG. 15.

Also, as shown in FIG. 16, a boundary portion between a first main surface 101 and an end surface 103 in a portion of each of the elongated portions 10A pressure-joined to the metallic cloth 3 is a chamfered portion 104. The first main surface 101 is the surface of each of the elongated portions 10A that comes into contact with the metallic cloth 3. The surface of the chamfered portion 104 forms the boundary between the first main surface 101 and the end surface 103, and is a curved surface that protrudes outward. Note that in the state in which the elongated portion 10A is pressure-joined to the metallic cloth 3, the first main surface 101 of the elongated portion 10A is the inner surface that comes into contact with the metallic cloth 3, and a second main surface 102 on the opposite side of the first main surface 101 is the outer surface on the side opposite to the metallic cloth 3.

For example, a case is conceivable in which the plate material that is source of the elongated portion 10A is obtained by performing punching processing on a plate-shaped metallic base material. Furthermore, in this case, it is conceivable that the first main surface 101 of the elongated portion 10A is the surface on the side that comes into contact with the punching blade in the punching processing, and that the second main surface 102 of the elongated portion 10A is the surface supported by the die in the punching processing. In this case, a burr 105 that appears due to the punching processing is formed in the boundary portion between the second main surface 102 and the end surface 103, and this burr 105 does not cause damage to the metallic cloth 3. Also, through ingenuity in the punching blade and die shape, it is possible to form the chamfered portion 104 without needing special chamfer processing.

Next, the wire harness 100D including the electromagnetic shielding tool 1C will be described with reference to FIGS. 18 and 19. In the wire harness 100D, the electrical wire holding member 91 is made of a non-conductive material. The electrical wire holding member 91 is a member that holds the end portions of multiple electrical wires 9 in a certain positional relationship, and electrically insulates the electrical wires 9 from each other.

For example, the electrical wire holding member 91 is a member made of a non-conductive synthetic resin. In this case, it is conceivable for the electrical wire holding member 91 to be a member made of a thermoplastic resin that has been formed by an insert mold in which the end portions of the parallel-arranged electrical wires 9 serve as the insert portions. The electrical wire holding member 91 is fitted into the opening formed in the casing. Accordingly, the gap between the electrical wires 9 and the casing in the opening of the casing is blocked.

As shown in FIG. 18, the electromagnetic shielding tool 1D of the wire harness 100D is fixed to a portion of a casing 8. In the example shown in FIG. 18, the pair of bracket body portions 2C are combined on two sides of the electrical wires 9, and the eave portions 20 at two locations at respective ends thereof are fixed, by screws 4, to support plates 82 formed so as to protrude from the casing 8. A coupling structure for coupling the two elongated portions 10 is provided at two locations at respective ends of the bracket body portions 2C. For this reason, the electromagnetic shielding tool 1D can be fixed according to the aspect shown in FIG. 18.

Also, as shown in FIG. 19, in the electromagnetic shielding tool 1D of the wire harness 100D as well, the length L1 of each elongated portion 10A in each of the two bracket sets 2C,4 is longer than the length L2 of the third outer edge portion 33 and the fourth outer edge portion 34 of the metallic cloth 3, similar to the electromagnetic shielding tool 1 shown in FIG. 4.

Applying the electromagnetic shielding tool 1D obtains effects similar to the case of applying the electromagnetic shielding tools 1 and 1A. Also, in electromagnetic shielding tool 1D, the elongated portions 10A are each joined to the metallic cloth 3 by being pressure-joined to an outer edge portion of the metallic cloth 3. This makes it possible to avoid the risk of the thin metallic cloth 3 being damaged by welding. Accordingly, it is possible to join the elongated portions 10A and the metallic cloth 3 while preventing damage to the thin metallic cloth 3.

Also, in the electromagnetic shielding tool 1D, the boundary portion between the end surface 103 and the first main surface 101 in contact with the metallic cloth 3 in the portion of each of the elongated portions 10A pressure-joined to the metallic cloth 3 is a chamfered portion 104. This prevents the metallic cloth 3 from being damaged due to being rubbed by the corners of the edges of the elongated portions.

Sixth Embodiment

Figure 20:
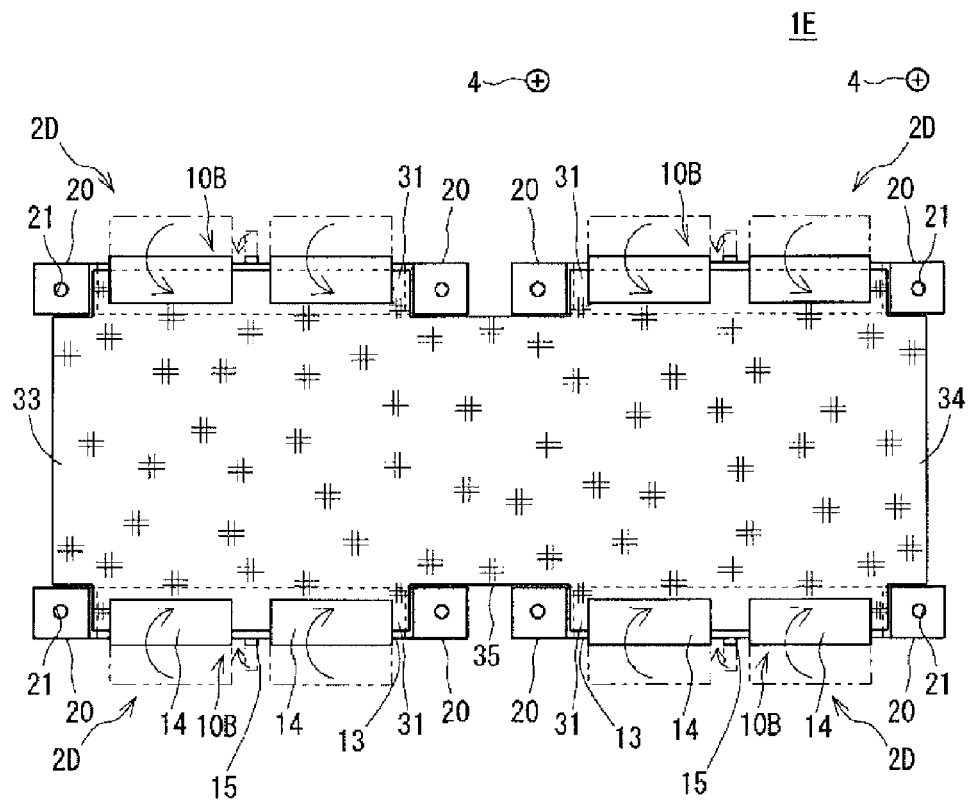
FIG. 20 is a plan view of an electromagnetic shielding tool 1E according to a sixth embodiment of this disclosure.
Figure 21:
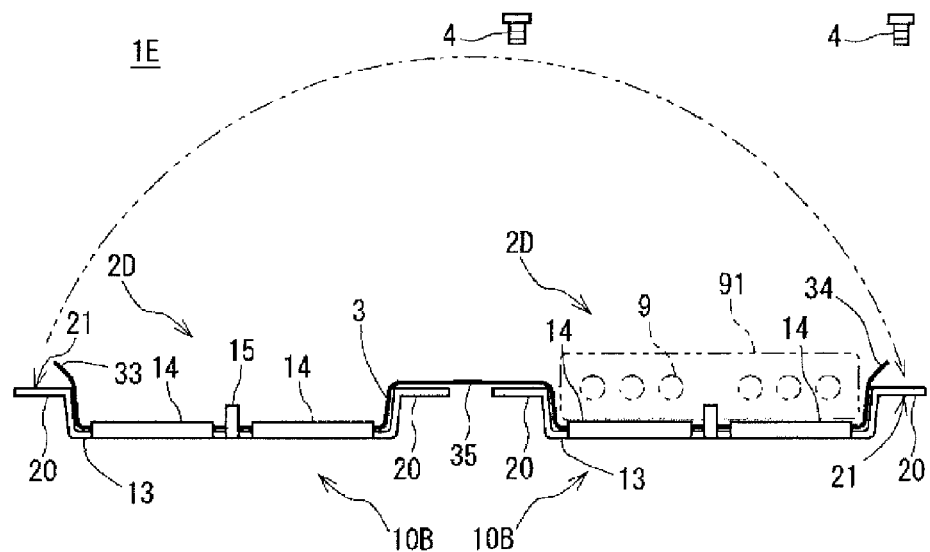
FIG. 21 is a front view of the electromagnetic shielding tool 1E.
Figure 22:
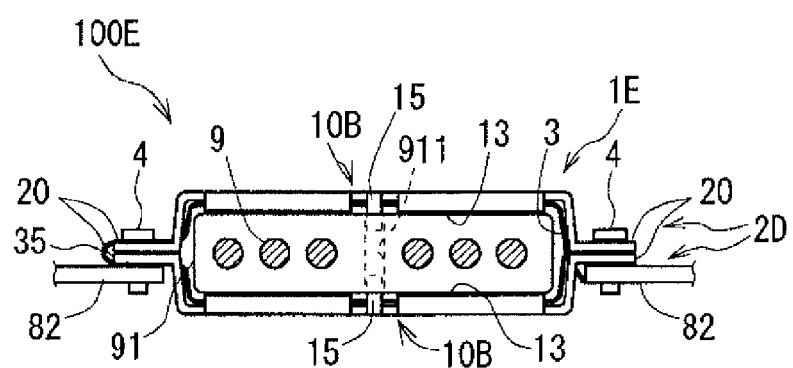
FIG. 22 is a front view of the electromagnetic shielding tool 1E.

Next, an electromagnetic shielding tool 1E and a wire harness 100E including the same according to a sixth embodiment will be described with reference to FIGS. 20 to 22. This electromagnetic shielding tool 1E has a configuration in which an element has been added to a portion of the elongated portions in the electromagnetic shielding tool 1D shown in FIGS. 15 to 19. In FIGS. 20 to 22, constituent elements that are the same as constituent elements shown in FIGS. 1 to 19 have been given the same reference signs. The following describes only differences in the electromagnetic shielding tool 1E from the electromagnetic shielding tool 1D.

FIG. 20 is a plan view of the electromagnetic shielding tool 1E, and FIG. 21 is a front view of the electromagnetic shielding tool 1E. Also, FIG. 22 is a front view of the wire harness 100E. Note that the electrical wires 9 and the electrical wire holding member 91 are drawn with virtual lines (dashed double-dotted lines) in FIG. 21.

As shown in FIGS. 20 and 21, the electromagnetic shielding tool 1E includes the metallic cloth 3 and two bracket sets 2D, 4 similar to the electromagnetic shielding tools 1, 1A, and 1E. The two bracket sets 2D,4 are each configured by two bracket body portions 2D and two screws 4. The two bracket body portions 2D each have one elongated portion 10B formed in the shape of a half-ring that spans over the electrical wires 9, and two eave portions 20 formed so as to be continuous with respective ends of the elongated portion 10B.

Specifically, the electromagnetic shielding tool 1E includes one metallic cloth 3 and four bracket body portions 2D. Also, the elongated portions 10B of the electromagnetic shielding tool 1E are respectively configured as portions of the four bracket body portions 2A that are each an independent member. Also, in the electromagnetic shielding tool 1E as well, the two elongated portions 10B are joined to the metallic cloth 3 by pressure-joining in a state in which the elongated portions 10B are arranged in series along an outer edge portion of the metallic cloth 3.

Also, each of the elongated portions 10B has one base portion 13 and multiple turn-back portions 14 that are continuous with the base portion 13. In the example shown in FIGS. 20 to 22, each of the elongated portions 10B has two turn-back portions 14 that are formed with a gap therebetween.

Also, the two elongated portions 10B in each of the two bracket sets 2D,4 are respectively provided with standing portions 15 for positioning that stand up in the direction in which the elongated portions 10B oppose each other. In the example shown in FIGS. 20 to 22, the standing portion 15 for positioning is formed at a position between the two turn-back portions 14 of the corresponding elongated portion 10B. Also, in the example shown in FIGS. 20 to 22, the standing portion 15 is a portion obtained by bending a portion of the plate-shaped elongated portion 10B.

As shown in FIG. 22, the wire harness 100E also includes multiple electrical wires 9, the electromagnetic shielding tool 1E, and the electrical wire holding member 91, similarly to the wire harness 100D. In the example shown in FIG. 22, the wire harness 100E includes six electrical wires 9, and these six electrical wires 9 include three electrical wires 9 for transmitting a first three-phase AC current and three electrical wires 9 for transmitting a second three-phase AC current.

Also, as shown in FIG. 22, the standing portions 15 are fitted into holes 911 for positioning that are formed in the electrical wire holding member 91. The electrical wire holding member 91 is a partner member to which the bracket body portions 2D are connected. Accordingly, the bracket body portions 2D and the electrical wire holding member 91 can be easily connected in the correct positional relationship. In the example shown in FIG. 22, the holes 911 for positioning are formed in portions of the electrical wire holding member 91 that are between the portion that holds the three electrical wires 9 for transmitting the first three-phase AC current and the portion for the three electrical wires 9 for transmitting the second three-phase AC current.

Other Embodiments

In the embodiments described above, the two elongated portions 10 that are combined with each other are formed in the same shape, but it is contemplated that the two elongated portions 10 that are combined with each other be formed in different shapes.

Also, in the electromagnetic shielding tools 1, 1A, 1B, 1C, 1D, and 1E, the relationship between the length L1 of the elongated portions 10, 10A, and 10B and the length L2 of the third outer edge portion 33 and the fourth outer edge portion 34 of the metallic cloth 3 is not necessarily limited to the case of being L1>L2. The case of L1<L2 and the case of L1=L2 are also contemplated.

It will be appreciated that the above-disclosed embodiments, or alternatives thereof, may be desirably combined into different systems or methods. Also, various alternatives, modifications, variations or improvements may be subsequently made by those skilled in the art, and are also intended to be encompassed by the following claims. As such, various changes may be made without departing from the spirit and scope of this disclosure as defined in the claims.

REFERENCE SIGNS LIST 1, 1A, 1B, 1C, 1D, 1E Electromagnetic shielding tool
2, 2A, 2B, 2C, 2D Bracket body portion (bracket)
3 Metallic cloth
4 Screw (coupling portion)
5 Metallic cloth joining member
8 Casing
9 Electrical wire
10, 10A, 10B Elongated portion
11 Projection
12 Extension portion
13 Base portion of elongated portion
14 Turn-back portion of elongated portion
15 Standing portion of elongated portion
19 Connecting portion
20 Eave portion (coupling portion)
21 Screw hole
31 First outer edge portion of metallic cloth
32 Second outer edge portion of metallic cloth
33 Third outer edge portion of metallic cloth
34 Fourth outer edge portion of metallic cloth
35 Intermediate portion of metallic cloth
81 Shield frame portion
82 Support plate
91 Electrical wire holding member
100, 100B, 100C, 100D, 100E Wire harness
101 First main surface of elongated portion
102 Second main surface of elongated portion
103 End surface of elongated portion
104 Chamfered portion of elongated portion
105 Burr
911 Hole in electrical wire holding member

The invention claimed is:

1. An electromagnetic shielding tool comprising:
a metallic cloth including a first outer edge portion and a second outer edge portion on a side opposite to the first outer edge portion, the metallic cloth comprising a metallic thread fabric; and
a plurality of bracket sets configured to hold the first outer edge portion and the second outer edge portion in a shape of a ring that surrounds a periphery of an electrical wire,
wherein each of the bracket sets comprises:
two elongated portions comprising a conductive material, the elongated portions joined to the metallic cloth and arranged in series along an outer edge portion of the metallic cloth and fixed to each other on two opposite sides of the electrical wire to form the ring that surrounds the electrical wire, and
at least one coupling portion that couples end portions of the two elongated portions to each other to detachably fix the two elongated portions in the ring shape.

2. The electromagnetic shielding tool according to claim 1, wherein each of the two elongated portions of the bracket sets is longer than a length of a third outer edge portion and a fourth outer edge portion on a side opposite to the third outer edge portion of the metallic cloth.

3. The electromagnetic shielding tool according to claim 1, wherein the two elongated portions of each of the bracket sets are fixed by a flexible continuous member at end portions opposite to the end portions coupled by the coupling portion.

4. The electromagnetic shielding tool according to claim 1, wherein the end portions coupled by the coupling portion overlap each other.

5. The electromagnetic shielding tool according to claim 2, further comprising a metallic cloth joining member comprising a metal that is welded to the third outer edge portion and the fourth outer edge portion.

6. The electromagnetic shielding tool according to claim 1, wherein each of the two elongated surfaces further comprises a plurality of projections formed on inner surfaces of the two elongated portions that face one another.

7. The electromagnetic shielding tool according to claim 1, wherein the metallic cloth is joined to a radially outer surface of each of the two elongated portions of the bracket sets.

8. The electromagnetic shielding tool according to claim 7, wherein the metallic cloth is pressure-joined to the two elongated portions of the bracket sets.

9. The electromagnetic shielding tool according to claim 8, wherein each elongated portion further comprises a chamfered portion that includes a base portion and a turn-back portion in contact with the metallic cloth.

10. The electromagnetic shielding tool according to claim 1, wherein each elongated portion further comprises a standing portion configured to stand up in a direction in which the elongated portions oppose each other.

11. A wire harness comprising:
an electrical wire; and
an electromagnetic shielding tool that surrounds a periphery of the electrical wire,
wherein the electromagnetic shielding tool comprises:
a metallic cloth including a first outer edge portion and a second outer edge portion on a side opposite to the first outer edge portion, the metallic cloth comprising a metallic thread fabric; and
a plurality of bracket sets configured to hold the first outer edge portion and the second outer edge portion in a shape of a ring that surrounds a periphery of the electrical wire,
wherein each of the bracket sets comprises:
two elongated portions comprising a conductive material, the elongated portions joined to the metallic cloth and arranged in series along an outer edge portion of the metallic cloth and fixed to each other on two opposite sides of the electrical wire to form the ring that surrounds the electrical wire, and
at least one coupling portion that couples end portions of the two elongated portions to each other to detachably fix the two elongated portions in a ring shape.

12. An electromagnetic shielding tool comprising:
a metallic cloth including a first outer edge portion and a second outer edge portion on a side opposite to the first outer edge portion, the metallic cloth comprising a metallic thread fabric; and
a plurality of bracket sets configured to hold the first outer edge portion and the second outer edge portion in a shape of a ring that surrounds a periphery of an electrical wire,
wherein each of the bracket sets comprises:
two elongated portions comprising a conductive material, the elongated portions joined to the metallic cloth and arranged in series along an outer edge portion of the metallic cloth and fixed to each other on two opposite sides of the electrical wire to form the ring that surrounds the electrical wire, at least one coupling portion that couples end portions of the two elongated portions to each other to fix the two elongated portions in the ring shape, and the metallic cloth is joined to a radially outer surface of each of the two elongated portions of the bracket sets.

* * * * *